(12) United States Patent
Iwashita et al.

(10) Patent No.: US 10,942,440 B2
(45) Date of Patent: Mar. 9, 2021

(54) MASK BLANK, PHASE SHIFT MASK, METHOD OF MANUFACTURING PHASE SHIFT MASK, AND METHOD OF MANUFACTURING SEMICONDUCTOR DEVICE

(71) Applicant: HOYA CORPORATION, Tokyo (JP)

(72) Inventors: Hiroyuki Iwashita, Tokyo (JP); Atsushi Matsumoto, Tokyo (JP); Osamu Nozawa, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 256 days.

(21) Appl. No.: 16/327,716

(22) PCT Filed: Aug. 2, 2017

(86) PCT No.: PCT/JP2017/028045
§ 371 (c)(1),
(2) Date: Feb. 22, 2019

(87) PCT Pub. No.: WO2018/037864
PCT Pub. Date: Mar. 1, 2018

(65) Prior Publication Data
US 2019/0187551 A1 Jun. 20, 2019

(30) Foreign Application Priority Data
Aug. 26, 2016 (JP) .............................. JP2016-165518

(51) Int. Cl.
*G03F 1/32* (2012.01)
*G03F 1/58* (2012.01)
(Continued)

(52) U.S. Cl.
CPC .................. *G03F 1/32* (2013.01); *G03F 1/26* (2013.01); *G03F 1/36* (2013.01); *G03F 1/58* (2013.01); *G03F 1/80* (2013.01); *H01L 21/3065* (2013.01)

(58) Field of Classification Search
CPC ..... G03F 1/32; G03F 1/36; G03F 1/26; G03F 1/80; G03F 1/58
See application file for complete search history.

(56) References Cited

U.S. PATENT DOCUMENTS

| | | |
|---|---|---|
| 5,514,499 A | 5/1996 | Iwamatsu et al. |
| 5,605,776 A | 2/1997 | Isao et al. |

(Continued)

FOREIGN PATENT DOCUMENTS

| | | |
|---|---|---|
| JP | 07-134392 A | 5/1995 |
| JP | 08-262688 A | 10/1996 |

(Continued)

OTHER PUBLICATIONS

International Search Report of PCT/JP2017/028045 dated Oct. 31, 2017.

*Primary Examiner* — Stewart A Fraser
(74) *Attorney, Agent, or Firm* — Kilpatrick Townsend & Stockton LLP

(57) ABSTRACT

Provided is a mask blank including a phase shift film having a transmittance of 20% or more difficult to achieve in a phase shift film of a single layer made of a silicon nitride material, and the phase shift film is achieved by using a structure having two or more sets of a stacked structure, each set including a low transmission layer and a high transmission layer disposed in order from a transparent substrate side.

The mask blank includes a phase shift film on a transparent substrate. The phase shift film has a function of transmitting exposure light of an ArF excimer laser at a transmittance of (Continued)

20% or more. The mask blank has two or more sets of a stacked structure, each set including a low transmission layer and a high transmission layer. The low transmission layer is formed of a silicon nitride-based material. The high transmission layer is formed of a silicon oxide-based material. The high transmission layer provided at an uppermost position is thicker than the high transmission layer provided at a position other than the uppermost position. The low transmission layer is thicker than the high transmission layer provided at a position other than the uppermost position.

26 Claims, 2 Drawing Sheets

(51) Int. Cl.
  *G03F 1/26* (2012.01)
  *G03F 1/36* (2012.01)
  *G03F 1/80* (2012.01)
  *H01L 21/3065* (2006.01)

(56) References Cited

U.S. PATENT DOCUMENTS

| | | |
|---|---|---|
| 6,274,280 B1 | 8/2001 | Carcia |
| 2003/0064297 A1 | 4/2003 | Shiota et al. |
| 2004/0023125 A1 | 2/2004 | Nozawa et al. |
| 2005/0112477 A1 | 5/2005 | Yoshikawa et al. |
| 2006/0121361 A1 | 6/2006 | Rolfson |
| 2015/0125785 A1 | 5/2015 | Inazuki et al. |
| 2015/0338731 A1* | 11/2015 | Nozawa ............... G03F 7/2006 430/5 |

FOREIGN PATENT DOCUMENTS

| | | |
|---|---|---|
| JP | 2002-296758 A | 10/2002 |
| JP | 2002-535702 A | 10/2002 |
| JP | 2004-062135 A | 2/2004 |
| JP | 2005-128278 A | 5/2005 |
| JP | 2014-137388 A | 7/2014 |
| JP | 2014-197190 A | 10/2014 |
| JP | 2015-111246 A | 6/2015 |
| JP | 2016-018192 A | 2/2016 |

* cited by examiner

MASK BLANK, PHASE SHIFT MASK, METHOD OF MANUFACTURING PHASE SHIFT MASK, AND METHOD OF MANUFACTURING SEMICONDUCTOR DEVICE

CROSS REFERENCE TO RELATED APPLICATIONS

This application is a National Stage of International Application No. PCT/JP2017/028045 filed Aug. 2, 2017, claiming priority based on Japanese Patent Application No. 2016-165518 filed Aug. 26, 2016.

TECHNICAL FIELD

The present invention relates to a mask blank, a phase shift mask manufactured using the mask blank, a method of manufacturing the phase shift mask, and a method of manufacturing a semiconductor device using the phase shift mask.

BACKGROUND ART

At steps in manufacturing a semiconductor device, a photolithography method is used to form a fine pattern. In formation of the fine pattern, a transfer mask is used. In association with a demand for a finer semiconductor device, a half tone phase shift mask has been recently used as a transfer mask. Additionally, to make a finer semiconductor device, a decrease in a wavelength of an exposure light source used in photolithography is needed, and an ArF excimer laser has been increasingly used for the exposure light source.

For a half tone phase shift mask, a phase shift film made of a molybdenum silicide (MoSi)-based material has been widely used. However, the phase shift film made of the molybdenum silicide-based material has been found to have low fastness to exposure light of an ArF excimer laser (wavelength: 193 nm) (so-called ArF light fastness).

Additionally, to enhance contrast of a half tone phase shift mask, an increase in a transmittance of a phase shift film has been recently investigated. Patent Literature 1 discloses, as a phase shift film having high fastness to exposure light of an ArF excimer laser and high transmittance, a phase shift film of a single layer made of a silicon nitride material (i.e., a material consisting of silicon and nitrogen) or a phase shift film of a single layer made of a silicon nitride oxide material (i.e., a material consisting of silicon, nitrogen, and oxygen).

On the other hand, Patent Literature 2 discloses a half tone phase shift mask including a phase shift film including a two-layer structure including a silicon nitride layer and a silicon oxide layer disposed in order from a transparent substrate side. Additionally, Patent Literature 3 discloses a half tone phase shift mask including a phase shift film including a multilayer structure having a plurality of sets of a stacked structure, each set including a silicon nitride layer and a silicon oxide layer disposed in order from a transparent substrate side.

CITATION LIST

Patent Literature

Patent Literature 1: JP 2015-111246 A
Patent Literature 2: JP 7-134392 A
Patent Literature 3: JP 2002-535702 T

SUMMARY OF INVENTION

Technical Problem

In the phase shift film of a single layer made of a silicon nitride material as described in Patent Literature 1, a transmittance to exposure light of an ArF exposure light (hereinafter referred to as ArF exposure light) can be increased to only approximately 18%. When the phase shift film includes oxygen incorporated into silicon nitride, the transmittance of the phase shift film can be increased. However, when a phase shift film of a single layer made of a silicon nitride oxide material is used, there is a problem of a decrease in etching selectivity for a transparent substrate formed of a material containing silicon oxide as a main component during patterning of the phase shift film by dry etching. Additionally, there is also a problem of a decrease in the repair rate ratio for the transparent substrate during EB defect repair. Note that the EB defect repair is a technique in which while unexcited fluoride-based gas such as $XeF_2$ is supplied to a black defect portion of a thin film pattern, the black defect portion is irradiated with an electron beam and thus, the black defect portion is converted into a volatile fluoride, and is removed.

The problems in the case of using the phase shift film of a single layer made of a silicon nitride oxide material can be solved by using a phase shift film including a two-layer structure including a silicon nitride layer (low transmission layer) and a silicon oxide layer (high transmission layer) disposed in order from the transparent substrate side, as disclosed in Patent Literature 2. In the case of constituting such a phase shift film including the two-layer structure, a thickness of each of the silicon nitride layer and the silicon oxide layer is optimized on the basis of a refractive index n and an extinction coefficient k of each of the silicon nitride layer and the silicon oxide layer. Thus, a transmittance of 20% or more, which is difficult to achieve in the phase shift film of a single layer made of a silicon nitride material can be achieved while a predetermined phase difference to ArF exposure light is secured. However, in the case of constituting the phase shift film including the two-layer structure including the silicon nitride layer and the silicon oxide layer, the thickness of each of the silicon nitride layer and the silicon oxide layer is large n particular, the thickness of the silicon oxide layer is large). Thus, there is a problem of a level difference of a pattern side wall likely to increase during patterning of the phase shift film by dry etching.

The problem in the case of using the phase shift film including the two-layer structure can be solved by using a phase shift film including a multilayer structure having a plurality of sets of a stacked structure, each set including a silicon nitride layer (low transmission layer) and a silicon oxide layer (high transmission layer) disposed in order from a transparent substrate side, as disclosed in Patent Literature 3. In the phase shift film of Patent Literature 3, the thicknesses of the silicon nitride layers in the plurality of sets of a stacked structure are the same as each other, and the thicknesses of the silicon oxide layers in the plurality of sets of a stacked structure are the same as each other. However, this specific configuration of the phase shift film disclosed in Patent Literature 3 is suitable for the case of using an F2 excimer laser having a wavelength of 157 nm as an exposure light source, but is not suitable for the phase shift film used in the case of using an ArF excimer laser as an exposure light source.

The present inventors have investigated a configuration of a phase shift film including a multilayer structure including a plurality of sets of a stacked structure, each set including a low transmission layer made of a silicon nitride-based material and a high transmission layer made of a silicon oxide-based material disposed in order from a transparent substrate side, and being suitable for the case of using an ArF excimer laser as an exposure light source. First, a phase shift film including a two-layer structure including a low transmission layer made of a silicon nitride-based material and a high transmission layer made of a silicon oxide-based material disposed in order from a transparent substrate side and being used in the case of using an ArF excimer laser as an exposure light source is subjected to simulation to determine an optimal thickness of each of the low transmission layer and the high transmission layer. In the simulation, a phase difference to ArF exposure light of the phase shift film falls within the range of $177\pm0.5°$, and a transmittance to ArF exposure light of the phase shift film falls within the range of $30\pm2\%$ (hereinafter, the transmittance to ArF exposure light will simply be referred to as a transmittance, and the phase difference to ArF exposure light will simply be referred to as a phase difference). Additionally, the simulation is performed under conditions where a refractive index n of the low transmission layer at a wavelength of ArF exposure light is 2.58, an extinction coefficient k of the low transmission layer at a wavelength of ArF exposure light is 0.36, a refractive index n of the high transmission layer at a wavelength of ArF exposure light is 1.59, and an extinction coefficient k of the high transmission layer at a wavelength of ArF exposure light is 0.00 (hereinafter, the refractive index n to ArF exposure light will be simply referred to as a refractive index n, and the extinction coefficient k to ArF exposure light will be simply referred to as an extinction coefficient k).

Next, a phase shift film including a four-layer structure including two sets of a stacked structure, each set including a low transmission layer and a high transmission layer disposed in order from a transparent substrate side is formed. In the phase shift film including the four-layer structure, thicknesses of the low transmission layers are the same in the two sets of a stacked structure, and thicknesses of the high transmission layers are the same in the two sets of a stacked structure. The total thickness of the low transmission layers disposed in the two sets of a stacked structure is the same as the thickness of the low transmission layer determined by the aforementioned simulation. The total thickness of the high transmission layers disposed inn the two sets of a stacked structure is the same as the thickness of the high transmission layer determined by the aforementioned simulation. That is, the thickness of the low transmission layer determined by the aforementioned simulation is evenly divided into the thicknesses of the low transmission layers disposed in the two sets of a stacked structure, and the thickness of the high transmission layer determined by the aforementioned simulation is also evenly divided into the thicknesses of the high transmission layers disposed in the two sets of a stacked structure. Additionally, a refractive index n and an extinction coefficient k of the low transmission layer disposed in each of the two sets of a stacked structure are 2.58 and 0.36, respectively. A refractive index n and an extinction coefficient k of the high transmission layer disposed in each of the two sets of a stacked structure are 1.59 and 0.00, respectively. When optical properties of the phase shift film including the four-layer structure including the high transmission layers each having an evenly divided thickness are measured, it has been found that there occurs a problem of the transmittance of the phase shift film largely decreasing to be out of the range of $30\pm2\%$ of the simulation condition. Additionally, it has been found that there occurs a problem of the phase difference of the phase shift film being out of the range of $177\pm0.5°$ of the simulation condition.

Therefore, the present invention has been made in view of the aforementioned problems. An object of the present invention is to provide a mask blank including a phase shift film having a transmittance of 20% or more that is difficult to achieve in a phase shift film of a single layer made of a silicon nitride material, and the phase shift film is achieved by using a structure having two or more sets of a stacked structure, each set including a low transmission layer and a high transmission layer disposed in order from a transparent substrate side. Additionally, another object of the present invention is to provide a phase shift mask manufactured using the mask blank. Further, still another object of the present invention is to provide a method of manufacturing such a phase shift mask. In addition, still another object of the present invention is to provide a method of manufacturing a semiconductor device using such a phase shift mask.

Solution to Problem

To solve the above-described problems, the present invention includes the following configurations.

Configuration 1

A mask blank including a phase shift film on a transparent substrate, wherein the phase shift film has a function of transmitting exposure light of an ArF excimer laser at a transmittance of 20% or more, the phase shift film includes a structure having two or more sets of a stacked structure, each set including a low transmission layer and a high transmission layer disposed in order from the transparent substrate side, the low transmission layer is formed of a material containing silicon and nitrogen and having a nitrogen content of 50 atom % or more, the high transmission layer is formed of a material containing silicon and oxygen and having an oxygen content of 50 atom % or more, the high transmission layer provided at an uppermost position is thicker than the high transmission layer provided at a position other than the uppermost position, and the low transmission layer is thicker than the high transmission layer provided at a position other than the uppermost position.

Configuration 2

A mask blank including a phase shift film on a transparent substrate, wherein the phase shift film has a function of transmitting exposure light of an ArF excimer laser at a transmittance of 20% or more, the phase shift film includes a structure having two or more sets of a stacked structure, each set including a low transmission layer and a high transmission layer disposed in order from the transparent substrate side, the low transmission layer is formed of a material containing silicon and nitrogen, the high transmission layer is formed of a material containing silicon and oxygen, the low transmission layer has a content of nitrogen larger than a content of nitrogen of the high transmission layer, the high transmission layer has a content of oxygen larger than a content of oxygen of the low transmission layer, the high transmission layer provided at an uppermost position is thicker than the high transmission layer provided at a position other than the uppermost position, and the low transmission layer is thicker than the high transmission layer provided at a position other than the uppermost position.

Configuration 3

The mask blank according to configuration 1 or 2, wherein the low transmission layer is formed of a material consisting of silicon and nitrogen, or a material consisting of silicon, nitrogen, and one or more elements selected from semimetal elements and non-metal elements, and the high transmission layer is formed of a material consisting of silicon and oxygen, or a material consisting of silicon, oxygen, and one or more elements selected from semimetal elements and non-metal elements.

Configuration 4

The mask blank according to configuration 1 or 2, wherein the low transmission layer is formed of a material consisting of silicon and nitrogen, and the high transmission layer is formed of a material consisting of silicon and oxygen.

Configuration 5

The mask blank according to any one of configurations 1 to 4, wherein the low transmission layer has a refractive index n of 2.0 or more at a wavelength of the exposure light, and an extinction coefficient k of 0.2 or more at a wavelength of the exposure light, and the high transmission layer has a refractive index n of less than 2.0 at a wavelength of the exposure light, and an extinction coefficient k of 0.1 or less at a wavelength of the exposure light.

Configuration 6

The mask blank according to any one of configurations 1 to 5, wherein the low transmission layer has a thickness of 30 nm or less.

Configuration 7

The mask blank according to any one of configurations 1 to 6, including a light shielding film on the phase shift film.

Configuration 8

A phase shift mask including, on a transparent substrate, a phase shift film having a transfer pattern, wherein the phase shift film has a function of transmitting exposure light of an ArF excimer laser at a transmittance of 20% or more, the phase shift film includes a structure having two or more sets of a stacked structure, each set including a low transmission layer and a high transmission layer disposed in order from the transparent substrate side, the low transmission layer is formed of a material containing silicon and nitrogen and having a nitrogen content of 50 atom % or more, the high transmission layer is formed of a material containing silicon and oxygen and having an oxygen content of 50 atom % or more, the high transmission layer provided at an uppermost position is thicker than the high transmission layer provided at a position other than the uppermost position, and the low transmission layer is thicker than the high transmission layer provided at a position other than the uppermost position.

Configuration 9

A phase shift mask including, on a transparent substrate, a phase shift film having a transfer pattern, wherein the phase shift film has a function of transmitting exposure light of an ArF excimer laser at a transmittance of 20% or more, the phase shift film includes a structure having two or more sets of a stacked structure, each set including a low transmission layer and a high transmission layer disposed in order from the transparent substrate side, the low transmission layer is formed of a material containing silicon and nitrogen, the high transmission layer is formed of a material containing silicon and oxygen, the low transmission layer has a content of nitrogen larger than a content of nitrogen of the high transmission layer, the high transmission layer has a content of oxygen larger than a content of oxygen of the low transmission layer, the high transmission layer provided at an uppermost position is thicker than the high transmission layer provided at a position other than the uppermost position, and the low transmission layer is thicker than the high transmission layer provided at a position other than the uppermost position.

Configuration 10

The phase shift mask according to configuration 8 or 9, wherein the low transmission layer is formed of a material consisting of silicon and nitrogen, or a material consisting of silicon, nitrogen, one or more elements selected from semimetal elements and non-metal elements, the high transmission layer is formed of a material consisting of silicon and oxygen, or a material consisting of silicon, oxygen, and one or more elements selected from semimetal elements and non-metal elements.

Configuration 11

The phase shift mask according to configuration 8 or 9, wherein the low transmission layer is formed of a material consisting of silicon and nitrogen, and the high transmission layer is formed of a material consisting of silicon and oxygen.

Configuration 12

The phase shift mask according to any one of configurations 8 to 11, wherein the low transmission layer has a refractive index n of 2.0 or more at a wavelength of the exposure light, and an extinction coefficient k of 0.2 or more at a wavelength of the exposure light, and the high transmission layer has a refractive index n of less than 2.0 at a wavelength of the exposure light, and an extinction coefficient k of 0.1 or less at a wavelength of the exposure light.

Configuration 13

The phase shift mask according to any one of configurations 8 to 12, wherein the low transmission layer has a thickness of 30 nm or less.

Configuration 14

The phase shift mask according to any one of configurations 8 to 13, including, on the phase shift film, a light shielding film having a pattern including a light shielding band.

Configuration 15

A method of manufacturing a phase shift mask using the mask blank according to configuration 7, including the steps of: forming a, transfer pattern in the light shielding film by dry etching; forming a transfer pattern in the phase shift film by dry etching using as a mask the light shielding film having the transfer pattern; and forming a pattern including a light shielding band in the light shielding film by dry etching using as a mask a resist film having a pattern including the light shielding hand.

Configuration 16

A method of manufacturing a semiconductor device including e step of transferring by exposure a transfer pattern to a resist film on a semiconductor substrate using the phase shift mask according to configuration 14.

Configuration 17

A method of manufacturing a semiconductor device including the step of transferring by exposure a transfer pattern to a resist film on a semiconductor substrate using a phase shift mask manufactured by the method of manufacturing a phase shift mask according to configuration 15.

Advantageous Effects of Invention

In a mask blank of the present invention, a phase shift film has a function of transmitting exposure light of an ArF excimer laser at a transmittance of 20% or more, and includes a structure having two or more sets of a stacked structure, each set including a low transmission layer and a high transmission layer disposed in order from the transparent substrate side. The low transmission layer is formed of a material containing silicon and nitrogen and having a nitrogen content of 50 atom % or more, and the high transmission layer is formed of a material containing silicon and oxygen and having an oxygen content of 50 atom % or more. The high transmission layer provided at an uppermost position is thicker than the high transmission layer provided at a position other than the uppermost position. The low transmission layer is thicker than the high transmission layer provided at a position other than the uppermost position. In such a mask blank, the transmittance of the phase shift film to exposure light of an ArF excimer laser can be a transmittance of 20% or more which is difficult to achieve in a phase shift film of a single layer made of a silicon nitride material. The transmittance of the phase shift film is 20% or more and thus, when a transfer pattern is formed in the phase shift film, and the transfer pattern is transferred by exposure to a resist film on a semiconductor substrate, a phase shift effect at a boundary between the transfer pattern and the resist film becomes significant, and contrast of a transfer image can be enhanced.

Additionally, in a mask blank of the present invention, a phase shift film has a function of transmitting exposure light of an ArF excimer laser at a transmittance of 20% or more, and includes a structure having two or more sets of a stacked structure, each set including a low transmission layer and a high transmission layer disposed in order from the transparent substrate side. The low transmission layer is formed of a material containing silicon and nitrogen, and the high transmission layer is formed of a material containing silicon and oxygen. The low transmission layer has a content of nitrogen larger than a content of nitrogen of the high transmission layer, and the high transmission layer has a content of oxygen larger than an oxygen content of the low transmission layer. The high transmission layer provided at an uppermost position is thicker than the high transmission layer provided at a position other than the uppermost position, and the low transmission layer is thicker than the high transmission layer provided at a position other than the uppermost position. In such a mask blank, the transmittance of the phase shift film to exposure light of an ArF excimer laser can be a transmittance of 20% or more difficult to achieve in a phase shift film of a single layer made of a silicon nitride material. The transmittance of the phase shift film is 20% or more and thus, when a transfer pattern is formed in the phase shift film, and the transfer pattern is transferred by exposure to a resist film on a semiconductor substrate, a phase shift effect at a boundary between the transfer pattern and the resist film becomes significant, and contrast of a transfer image can be enhanced.

Additionally, in a phase shift mask of the present invention, a phase shift film including a transfer pattern includes the same configuration as the configuration of the phase shift film of each mask blank of the present invention. In such a phase shift mask, when the transfer pattern is transferred by exposure to a resist film on a semiconductor substrate, a phase shift effect at a boundary between the transfer pattern and the resist film becomes significant, and contrast of a transfer image can be enhanced. Therefore, each phase shift mask of the present invention is a phase shift mask having high transfer accuracy.

DESCRIPTION OF EMBODIMENTS

Figure 1:
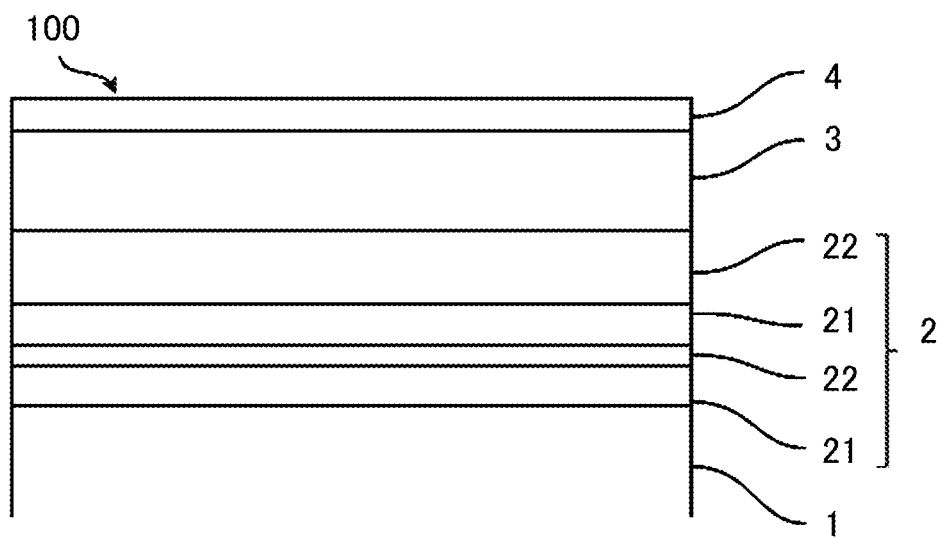
FIG. 1 is a cross-sectional view illustrating a configuration of a mask blank according to an embodiment of the present invention.

First, the circumstances leading to the completion of the present invention will be described.

To achieve a transmittance of 20% or more which is difficult to achieve in a phase shift film of a single layer made of a silicon nitride material, the present inventors have attempted to constitute a phase shift film by combining a low transmission layer made of a silicon nitride-based material with a high transmission layer made of a silicon oxide-based material and having a high transmittance to exposure light of an ArF excimer laser.

Then, a phase shift film including a two-layer structure including a low transmission layer made of a silicon nitride-based material and a high transmission layer made of a silicon oxide-based material disposed in order from a transparent substrate side was subjected to simulation to determine an optimal thickness of each of the low transmission layer and the high transmission layer. In the simulation, a phase difference serving as a target (hereinafter referred to as a target phase difference) falls within the range of 177±0.5° and a transmittance serving as a target (hereinafter referred to as a target transmittance) falls within the range of 30±2%. Additionally, the simulation is performed under conditions including a refractive index n of the low transmission layer of 2.58, an extinction coefficient k of the low transmission layer of 0.36, a refractive index n of the high transmission layer of 1.59, and an extinction coefficient k of the high transmission layer of 0.00.

In the phase shift film including such a two-layer structure, occurrence of a problem of a level difference of a pattern side wall likely to increase during patterning of the phase shift film by dry etching cannot be avoided. Therefore, the present inventors have investigated a phase shift film including a multilayer structure including a plurality of sets of a stacked structure, each set including a low transmission layer made of a silicon nitride-based material and a high transmission layer made of a silicon oxide-based material disposed in order from a transparent substrate side. Note that in a case where the low transmission layer and the high transmission layer are disposed in the reverse order, there may occur such a problem that etching selectivity between the high transmission layer being in contact with a transparent substrate and the transparent substrate becomes difficult to obtain in dry etching with fluorine-based gas performed when a pattern is formed in the phase shift film.

Next, a phase shift film including a four-layer structure including two sets of a stacked structure, each set including a low transmission layer made of a silicon nitride-based material and a high transmission layer made of a silicon oxide-based material disposed in order from a transparent substrate side is formed, in the phase shift film including the four-layer structure, thicknesses of the low transmission layers are the same in the two sets of a stacked structure, and thicknesses of the high transmission layers are also the same in the two sets of a stacked structure. The total thickness of the low transmission layers disposed in the two sets of a stacked structure is the same as the thickness of the low transmission layer determined by the aforementioned simulation. The total thickness of the high transmission layers disposed in the two sets of a stacked structure is the same as the thickness of the high transmission layer determined by the aforementioned simulation. That is, the thickness of the low transmission layer determined by the simulation is evenly divided into the thicknesses of the low transmission layers of the two sets of a stacked structure and the thickness of the high transmission layer determined by the simulation was also evenly divided into the thicknesses of the high transmission layers of the two sets of a stacked structure. Additionally, a refractive index n and an extinction coefficient k of the low transmission layer in each of the two sets of a stacked structure were 2.58 and 0.36, respectively. A refractive index n and an extinction coefficient k of the high transmission layer in each of the two sets of a stacked structure were 1.59 and 0.00, respectively. Note that here, the "same" means that the difference falls within error range in terms of manufacturing.

When optical properties of the phase shift film including the high transmission layers each having an evenly divided thickness (hereinafter referred to as a phase shift film of an even division type) are measured, it has been found that the transmittance of the phase shift film largely decreases to be out of the range of 30±2% being the target transmittance in the simulation. Additionally, it has been found that a phase difference of the phase shift film is out of the range of 177±0.5° being the target refractive index in simulation.

To solve these problems, the present inventors have formed a phase shift film including a four-layer structure in which a thickness of a high transmission layer provided at an uppermost position is different from a thickness of a high transmission layer provided at a position other than the uppermost position at is, a high transmission layer sandwiched between low transmission layers) under conditions of the total thickness of the high transmission layers disposed in two sets of a stacked structure is the same as the thickness of the high transmission layer determined by the aforementioned simulation. However, the thickness of the low transmission layer disposed in each of the two sets of a stacked structure is the same as in the phase shift film of an even division type. Here, the "same" means that the difference falls within an error range in terms of manufacturing. As a result, it has been found that in the case of the phase shift film in which the thickness of the high transmission layer provided at the uppermost position is larger than the thickness of the high transmission layer provided at a position other than the uppermost position, and the thickness of the low transmission layer is larger than the thickness of the high transmission layer provided at a position other than the uppermost position (hereinafter, such a phase shift film will be referred to as a phase shift film of a large-thickness uppermost layer type), a transmittance of the phase shift film can fall within the range of 30±2% being the target transmittance in the simulation and a phase difference of the phase shift film can fall within the range of 177±0.5° being the target phase difference in the simulation.

Next, a phase shift film including an eight-layer structure including four sets of a stacked structure, each set including a low transmission layer made of a silicon nitride-based material and a high transmission layer made of a silicon oxide-based material disposed in order a transparent substrate side is formed in a case where the high transmission layer in each of the four sets of a stacked structure has an evenly divided thickness (even division type) and in a case where the thickness of the high transmission layer provided at the uppermost position is larger than the thickness of the high transmission layer provided at a position other than the uppermost position (large-thickness uppermost layer type). As a result, it has been found that, as with the case of the phase shift film including the four-layer structure, a transmittance of the phase shift film of an even division type largely decreases to be out of the range of 30±2% being the target transmittance in the simulation, and a phase difference of the phase shift film of an even division type is out of the range of 177±0.5° being the target phase difference in the simulation. Additionally, it has been found that, as with the case of the phase shift film including the four-layer structure, a transmittance of the phase shift film of a large-thickness uppermost layer type can fall within the range of 30±2% being the target transmittance in the simulation, and a phase difference of the phase shift film of a large-thickness uppermost layer type can fall within the range of 177±0.5° being the target phase difference in the simulation.

For further investigation of these results, as with the case where the target transmittance falls within the range of 30±2%, simulation is performed in a case where a target transmittance falls within each of the range of 22±2%, the range of 33±2%, and the range of 36±2%. After the simulation is performed, a phase shift film of an even division type including a four-layer structure, a phase shift film of a large-thickness uppermost layer type including a four-layer structure, a phase shift film of an even division type including an eight-layer structure, and a phase shift film of a large thickness uppermost layer type including an eight-layer structure were formed.

As a result, it has been found that, a transmittance of each of the phase shift film of an even division type including the four-layer structure and the phase shift film of an even division type including the eight-layer structure largely decreases to be out of the target transmittance range in the simulation regardless of the target transmittances. Additionally, it has been found that in most of the target transmittances, a phase difference of each of the phase shift film of an even division type including the four-layer structure and the phase shift film of an even division type including the eight-layer structure is out of the range of 177±0.5° being the target phase difference. Additionally, it has been found that a transmittance of each of the phase shift films of a large-thickness uppermost layer type can fall within the target transmittance range in the simulation and a phase difference of each of the phase shift films of a large-thickness uppermost layer type can fall within the range of 177±0.5° being the target phase difference in the simulation.

From the aforementioned results, the present inventors have concluded that when in a phase shift film including a structure having two or more sets of a stacked structure, each set including a low transmission layer and a high transmission layer in order from a transparent substrate side, a thickness of the high transmission layer provided at the uppermost position is made larger than a thickness of the high transmission layer provided at a position other than the uppermost position, and a thickness of the low transmission layer is made larger than a thickness of the high transmission layer provided at a position other than the uppermost position, a transmittance of 20% or more can be achieved.

Note that the transmittance of each of the above-described phase shift films of an even division type largely decreases to be out of the target transmittance range in the simulation, and the phase difference of each of the phase shift films of an even division type becomes out of the range of 177±0.5° being the target phase difference in the simulation, and this is estimated due to influence of multiple reflection caused by evenly distributing the low transmission layers and the high transmission layers constituting the phase shift film to each of two or more sets of a stacked structure. That is, this is estimated due to that the thickness of the high transmission layer sandwiched between the two low transmission layers in each of the phase shift films of an even division type is larger than in each of the phase shift films of a large-thickness uppermost layer type; however, owing to this, a phase difference between a portion of exposure light multiple-reflected in the high transmission layer and the remaining exposure light passing through the high transmission layer without multiple reflection increases, and owing to an interference effect, attenuation in exposure light passing through the phase shift film increases. However, this estimation is based on the inference of the present inventors at the time of the application, and is not intended to limit the scope of the present invention.

Next, embodiments of the present invention will be described.

FIG. 1 is a cross-sectional view illustrating a configuration of a mask blank 100 according to an embodiment of the present invention.

The mask blank 100 of the present invention is a mask blank including a phase shift film 2 on a transparent substrate 1. The phase shift film 2 has a function of transmitting exposure light of an ArF excimer laser at a transmittance of 20% or more, and includes a structure having two or more sets of a stacked structure, each set including a low transmission layer 21 and a high transmission layer 22 disposed in order from the transparent substrate 1 side. The low transmission layer 21 is formed of a material containing silicon and nitrogen and having a nitrogen content of 50 atom % or more. The high transmission layer 22 is formed of a material containing silicon and oxygen and having an oxygen content of 50 atom % or more. The high transmission layer 22 provided at an uppermost position is thicker than the high transmission layer 22 provided at a position other than the uppermost position. The low transmission layer 21 is thicker than the high transmission layer 22 provided at a position other than the uppermost position.

Additionally, the mask blank 100 of the present invention is a mask blank including a phase shift film 2 on a transparent substrate 1. The phase shift film 2 has a function of transmitting exposure light of an ArF excimer laser at a transmittance of 20% or more, and includes a structure having two or more sets of a stacked structure, each set including a low transmission layer 21 and a high transmission layer 22 in order from the transparent substrate 1 side. The low transmission layer 21 is formed of a material containing silicon and nitrogen. The high transmission layer 22 is formed of a material containing silicon and oxygen. The low transmission layer 21 has a content of nitrogen larger than a content of nitrogen of the high transmission layer 22. The high transmission layer 22 has a content of oxygen larger than a content of oxygen of the low transmission layer 21. The high transmission layer 22 provided at the uppermost position is thicker than the high transmission layer 22 provided at a position other than the uppermost position. The low transmission layer 21 is thicker than the high transmission layer 22 provided at a position other than the uppermost position.

The thicknesses of the low transmission layers 21 may be the same or different from each other in the two or more sets of a stacked structure. Additionally, the composition of the low transmission layers 21 may be the same or different from each other in the two or more sets of a stacked structure. Additionally, the thicknesses of the high transmission layers 22 provided at the positions other than the uppermost position may be the same or different from each other in the two or more sets of a stacked structure. Additionally, the composition of the high transmission layer 22 provided at the uppermost position may be the same or different from the composition of the high transmission layer 2 provided at a position other than the uppermost position. Additionally, the composition of the high transmission layers 22 provided at positions other than the uppermost position may be the same or different from each other in the two or more sets of a stacked structure.

The mask blank 100 illustrated in FIG. 1 includes a structure where the phase shift film 2, a light shielding film 3, and a hard mask film 4 are stacked in order on the transparent substrate 1.

The transparent substrate 1 can be formed of synthetic quartz glass, quartz glass, aluminosilicate glass, soda-lime glass, low thermal expansion glass ($SiO_2$—$TiO_2$ glass, etc.), or the like. Among these, the synthetic quartz glass has a high transmittance to exposure light of an ArF excimer laser, and is particularly preferable as the material forming the transparent substrate of the mask blank.

The phase shift film 2 has a function of transmitting ArF exposure light at a transmittance of 20% or more. In exposure and development processes for a resist film on a semiconductor substrate (wafer), a bright-field mask (transfer mask having a high pattern open area ratio) used in negative tone development (NTD) is used. In the bright-field phase shift mask, a phase shift film having a higher transmittance than a transmittance of a conventional phase shift film (by approximately 6%) improves balance between 0-order light and primary light having passed through a transparent portion, and improves pattern resolution on the resist film. This is because exposure light having passed through the phase shift film interferes with the 0-order light to further increase an effect of attenuating light intensity. Additionally, a transmittance of the phase shift film 2 to ArF exposure light is preferably 36% or less. When the transmittance exceeds 36%, the thickness of all the phase shift film becomes large.

To obtain an appropriate phase shift effect, the phase shift film 2 has a function of generating a predetermined phase difference between ArF exposure light having passed through the phase shift film and ArF exposure light having passed through air by the same distance as the thickness of the phase shift film 2. The phase difference is preferably within the range of 150° or more and 200° or less. A lower limit value of the phase difference in the phase shift film 2 is more preferably 160° or more, and further preferably 170° or more. On the other hand, an upper limit value of the phase difference in the phase shift film 2 is more preferably 190° or less, and further preferably 180° or less.

The phase shift film 2 of the present invention includes a structure having two or more sets of a stacked structure, each set including the low transmission layer 21 and the high transmission layer 22 disposed in order from the transparent substrate 1 side. The phase shift film 2 illustrated in FIG. 1 includes two sets of a stacked structure, each set including the low transmission layer 21 and the high transmission layer 22 stacked in this order from the transparent substrate 1 side.

A refractive index n to ArF exposure light of a silicon-based film is very small and an extinction coefficient k to ArF exposure light of the silicon-based film is large. As a nitrogen content in the silicon-based film becomes larger, the refractive index n becomes larger, and the extinction coefficient k becomes smaller. Therefore, to secure a transmittance required for the phase shift film 2 and to secure a phase difference required for the phase shift film 2 having a smaller thickness, the low transmission layer 21 is formed of a material containing silicon and nitrogen and having a nitrogen content larger than a nitrogen content of the high transmission layer 22 described below, or a material having a nitrogen content of 50 atom % or more (hereinafter these materials will be referred to collectively as a silicon nitride-based material). The nitrogen content of the low transmission layer 21 is preferably 52 atom % or more. Additionally, the nitrogen content of the low transmission layer 21 is preferably 57 atom % or less, and more preferably 55 atom % or less.

For example, the low transmission layer 21 is formed of a material consisting of silicon and nitrogen or a material containing one or more elements selected from semimetal elements and non-metal elements incorporated into a material consisting of silicon and nitrogen a material consisting of silicon, nitrogen, and one or more elements selected from semimetal elements and non-metal elements).

The low transmission layer 21 contains no transition metal that can be a factor decreasing light fastness to ArF exposure light. Additionally, since there is no ruling out of a possibility that a metal element might become a factor of decreasing light fastness to the ArF exposure light, it is desirable that the low transmission layer 21 contains no metal element other than a transition metal.

The low transmission layer 21 may contain any semimetal element in addition to silicon. In a case where among these semimetal elements, the low transmission layer 21 contains one or more elements selected from boron, germanium, antimony, and tellurium, an increase in conductivity of silicon used as a sputtering target can be expected and thus, such a case is preferable.

The low transmission layer 21 may contain any non-metal element in addition to nitrogen. Here, the non-metal element includes a narrowly-defined non-metal element (carbon, oxygen, phosphorus, sulfur, selenium, and hydrogen), halogen (fluorine, chlorine, bromine, iodine, etc.), and a noble gas. Among these non-metal elements, the low transmission layer 21 preferably contains one or more elements selected from carbon, fluorine, and hydrogen. An oxygen content of the low transmission layer 21 is preferably 10 atom % or less, and more preferably 5 atom % or less. It is further preferable that the low transmission layer 21 contains substantially no oxygen (at a detection lower limit value or less when composition analysis using X-ray Photoelectron Spectroscopy (XPS) is performed). When a film of a silicon nitride-based material contains oxygen, the extinction coefficient k tends to largely decrease, and the thickness of all the phase shift film 2 increases. Additionally, the transparent substrate 1 is generally formed of a material containing silicon oxide as a main component such as synthetic quartz glass. When the low transmission layer 21 is disposed contact with a surface of the transparent substrate 1 and contains oxygen, the difference between composition of a film of a silicon nitride-based material containing oxygen and composition of the transparent substrate becomes small, and there may occur such a problem that etching selectivity between the low transmission layer 21 being in contact with the transparent substrate 1 and the transparent substrate 1 becomes difficult to obtain in dry etching with fluorine-based gas performed when a pattern is formed in the phase shift film 2.

The low transmission layer 21 may contain a noble gas. The noble gas is an element existing in a film forming chamber during formation of a thin film by reactive sputtering and accordingly being capable of increasing a deposition rate to improve productivity. The noble gas becomes plasma and collides with a target. As a result, a target constituent element is emitted from the target. While the target constituent element incorporates a reactive gas, the target constituent element is stacked on the transparent substrate 1 to form the thin layer. The noble gas in the film forming chamber is slightly incorporated until the target constituent element adheres to the transparent substrate after the target constituent element is emitted from the target. Preferable examples of the noble gas necessary for the reactive sputtering include argon, krypton, and xenon. Additionally, to relax a stress of the thin film, helium and neon having a small atomic weight can be incorporated positively in the thin film.

The low transmission layer 21 is preferably formed of the material consisting of silicon and nitrogen. Note that the noble gas is an element difficult to detect even by performing composition analysis such as Rutherford Back-Scattering spectrometry (RBS) and XPS on the thin film. Therefore, the aforementioned material consisting of silicon and nitrogen can be considered to include a material containing the noble gas.

A refractive index n to ArF exposure light of the silicon-based film is very small and an extinction coefficient k to ArF exposure light of the silicon-based film is large. As the oxygen content in the silicon-based film becomes larger, the refractive index n tends to become larger, although this tendency is less significant than in the case of containing nitrogen. Additionally, as the oxygen content in the silicon-based film becomes larger, the extinction coefficient k tends to become smaller, and this tendency is more significant than in the case of containing nitrogen. Therefore, to secure a transmittance required for the phase shift film 2 and to secure a phase difference required for the phase shift film 2 having a smaller thickness, the high transmission layer 22 is formed of a material containing silicon and oxygen and having an oxygen content larger than an oxygen content of the low transmission layer 21 or a material having an oxygen content of 50 atom % or more (hereinafter, these materials will be referred to collectively as a silicon oxide-based material). The oxygen content of the high transmission layer 22 is preferably 52 atom % or more. Additionally, the oxygen content of the high transmission layer 22 is preferably 67 atom % or less, and more preferably 65 atom % or less.

For example, the high transmission layer 22 is formed of a material consisting of silicon and oxygen or a material containing one or more elements selected from semimetal elements and non-metal elements incorporated into a material consisting of silicon and oxygen (i.e., a material consisting of silicon, oxygen, one or more elements selected from semimetal elements and non-metal elements).

The high transmission layer 22 contains no transition metal that can become a factor of decreasing the transmittance to ArF exposure light and of decreasing light fastness to ArF exposure light. Additionally, since there is no ruling out a possibility that a metal element other than a transition metal might become a factor of decreasing the transmittance to ArF exposure light and of decreasing light fastness to ArF exposure light, it is desirable that the high transmission layer 22 contains no metal element other than a transition metal.

The high transmission layer 22 may contain any semimetal element in addition to silicon. In a case where among the semimetal elements, the high transmission layer 22 contains one or more elements selected from boron, germanium, antimony, and tellurium, an increase in conductivity of silicon used as a sputtering target can be expected and thus, such a case is preferable.

The high transmission layer 22 may contain any non-metal element in addition to oxygen. Here, the non-metal element includes a narrowly-defined non-metal element (nitrogen, carbon, phosphorus, sulfur, selenium, and hydrogen), halogen (fluorine, chlorine, bromine, iodine, etc.), and a noble gas. Among the non-metal elements, the high transmission layer 22 preferably contains one or more elements selected from carbon, fluorine, and hydrogen.

The high transmission layer 22 may contain a noble gas. The noble gas is an element existing in a film forming chamber during formation of a thin film by sputtering and accordingly being capable of increasing a deposition rate to improve productivity. Preferable examples of the noble gas necessary for the sputtering include argon, krypton, and xenon. Additionally, to relax a stress of the thin film, helium and neon having a small atomic weight can be incorporated positively in the thin film.

The high transmission layer 22 is preferably formed of a material consisting of silicon and oxygen. Note that the noble gas is an element difficult to detect even by performing composition analysis such as RBS and XPS on the thin film. Therefore, the material consisting of silicon and oxygen can be considered to include a material containing the noble gas.

The number of sets of a stacked structure, each set including the low transmission layer 21 and the high transmission layer 22 in the phase shift film 2 is two (a total of four layers more. The number of sets of a stacked structure is preferably 10 (a total of 20 layers) or less, more preferably 9 (a total of 18 layers) or less, and further preferably 8 (a total of 16 layers) or less. When the phase shift film 2 having a predetermined transmittance and a predetermined phase difference is designed to have more than 10 sets of a stacked structure, a thickness of the low transmission layer 21 becomes small, and stable film formation becomes difficult.

A thickness of the high transmission layer 22 provided at the uppermost position is larger than a thickness of the high transmission layer 22 provided at a position other than the uppermost position (i.e., the high transmission layer 22 sandwiched between the low transmission layers 21). Additionally, a thickness of the low transmission layer 21 is larger than a thickness of the high transmission layer 22 provided at a position other than the uppermost position. When the thickness of the high transmission layer 22 provided, at the uppermost position is equal to or less than the thickness of the high transmission layer 22 provided at a position other than the uppermost position, or the thickness of the low transmission layer 21 is equal to or less than the thickness of the high transmission layer 22 provided at a position other than the uppermost position, the phase shift film 2 cannot achieve the required transmittance and phase difference. The thickness of the high transmission layer 22 provided at the uppermost position is preferably 5 nm or more, and more preferably 7 nm or more. Additionally, the thickness of the high transmission layer 22 provided at the uppermost position is preferably 60 nm or less.

The thickness of the low transmission layer 21 is preferably 30 nm or less, and more preferably 25 nm or less. When the thickness of the low transmission layer 21 exceeds 30 nm, a level difference of a pattern side wall is likely to be generated during patterning of the phase shift film by dry etching. Additionally, the thickness of the low transmission layer 21 is preferably 5 nm or more, and more preferably 6 nm or more. When a thickness of the low transmission layer 21 is less than 5 nm, since the number of the low transmission layers 21 is 10 or less, the total film thickness of the low transmission layers 21 becomes small. In this case, since a phase difference secured by the low transmission layer 21 becomes small, a predetermined phase difference may not be able to be obtained as long as the film thickness of the high transmission layer 22 provided at the uppermost position is largely increased.

The thickness of the high transmission layer 22 provided at a position other than the uppermost position is preferably 4 nm or less, and more preferably 3 nm or less. When the thickness of the high transmission layer 22 provided at a position other than the uppermost position exceeds 4 nm, a level difference of a pattern side wall is likely to be generated during patterning of the phase shift film by dry etching. Additionally, the thickness of the high transmission layer 22 provided at a position other than the uppermost position is preferably 1 nm or more, and more preferably 1.5 nm or more. When the thickness of the high transmission layer 22 provided at a position other than the uppermost position is less than 1 nm, it becomes difficult to stably form the high transmission layer 22 provided at a position other than the uppermost position.

Although the thicknesses of the low transmission layers 21 may not be the same as each other, the difference in the thickness between the low transmission layers 21 is preferably small. The difference in the thickness between the low transmission layers 21 is preferably within the range of 20%, more preferably within the range of 10%, and further preferably within the range of 5%. On the other hand, although the thickness of the high transmission layer 22 provided at a position other than the uppermost position may not be the same as each other as long as the high transmission layer 22 provided at a position other than the uppermost has a thickness smaller than the thickness of the high transmission layer 22 provided at the uppermost position, the difference in the thickness between the high transmission layers 22 provided at the positions other than the uppermost position is preferably small. The difference in the thickness between the high transmission layers 22 is preferably within the range of 40%, more preferably within the range of 30%, and further preferably within the range of 20%. Note that in this case, the thickness of the high transmission layer 22 provided at the uppermost position is required to be larger than the largest thickness of the high transmission layer 22 of the high transmission layers 22 provided at the positions other than the uppermost position.

The low transmission layer 21 has a refractive index n to ArF exposure light of preferably 2.0 or more, more preferably 2.2 or more, and further preferably 2.4 or more. The low transmission layer 21 has a refractive index n to ArF exposure light of preferably 2.7 or less, and more preferably 2.6 or less. Additionally, the low transmission layer 21 has an extinction coefficient k to ArF exposure light of preferably 0.2 or more. The high transmission layer 22 has a refractive index n to ArF exposure light of preferably less than 2.0, more preferably 1.9 or less, and further preferably 1.8 or less. The high transmission layer 2 has a refractive index n to ArF exposure light of preferably 1.4 or more, and more preferably 1.5 or more. Additionally, the high transmission layer 22 has an extinction coefficient k to ArF exposure light of preferably 0.1 or less. The high transmission layer 22 has an extinction coefficient k to ArF exposure light of preferably 0 or more. When the phase shift film 2 is constituted to include or more sets of a stacked structure, each set including a low transmission layer and a high transmission layer disposed in order from the transparent substrate side, the refractive index n and the extinction coefficient k of each of the low transmission layer 21 and the high transmission layer 22 are within the aforementioned ranges, a predetermined phase difference and a predetermined transmittance to ArF exposure light being optical properties required of the phase shift film 2 are easy to obtain.

A refractive index n and an extinction coefficient k of a thin film are not determined by composition of the thin film alone. A film density and a crystal state of the thin film are also elements influencing the refractive index n and the extinction coefficient k. Therefore, conditions used when the thin film is formed by sputtering are adjusted to form the thin film having a predetermined refractive index n and a predetermined extinction coefficient k. A way to obtain the refractive index n and the extinction coefficient k of the low transmission layer 21 falling within the aforementioned ranges includes, but not limited to, adjusting a ratio of a noble as and a reactive gas in a mixed gas when the film formation is performed by reactive sputtering. There are various ways to obtain the refractive index n and the extinction coefficient k of the low transmission layer 21 falling within the aforementioned range, including adjusting a pressure within the film forming chamber when the film formation is performed by reactive sputtering, adjusting electric power applied to the target, and adjusting a positional relationship such as a distance between the target and the transparent substrate. Additionally, these film forming conditions are specific to a film forming device, and are appropriately adjusted to form the thin film having the predetermined refractive index n and the predetermined extinction coefficient k.

The transparent substrate 1 is generally formed of a material containing silicon oxide as a main component, such as synthetic quartz glass. Additionally, in forming a pattern by dry etching in the phase shift film 2 including the low transmission layer 21 made of the silicon nitride-based material, fluorine-based gas such as $SF_6$ having a relatively small etching rate in dry etching is generally used for a material containing silicon oxide as a main component. In the phase shift film 2 of the present invention, the low transmission layer 21 and the high transmission layer 22 are disposed in order from the transparent substrate 1 side. Thus, etching selectivity between the low transmission layer 21 being in contact with the transparent substrate 1 and the transparent substrate 1 is obtained in dry etching with fluorine-based gas performed when a pattern is formed in the phase shift film.

In EB defect correction, at least any one of Auger electrons, secondary electrons, characteristic X-rays, and backscattered electrons discharged from an irradiated portion during irradiation of a black defect portion with an electron beam is detected, and a change of the detected one is observed to detect an endpoint of correction. For example, in the case of detecting Auger electrons discharged from a portion irradiated with an electron beam, a change in material composition is mainly observed by Auger electron spectroscopy (AES). Additionally, in the case of detecting secondary electrons, a change in a surface shape is mainly observed from an SEM image. Further, in the case of detecting characteristic X-rays, a change in material composition is mainly observed by energy dispersive X-ray spectroscopy (EDX) or wavelength dispersive X-ray spectroscopy (WDX). In the case of detecting backscattered electrons, a change in material composition or a crystal state is mainly observed by electron backscatter diffraction (EBSD). The transparent substrate 1 is generally formed of a material containing silicon oxide as a main component, such as synthetic quartz glass. In the phase shift film 2 of the present invention, the low transmission layer 21 and the high transmission layer are disposed in order from the transparent substrate side. Therefore, in the detection of the endpoint between the phase shift film 2 and the transparent substrate 1, a change from a decrease in detection intensity of nitrogen to an increase in detection intensity of oxygen with progression of correction can be observed to determine the endpoint.

The low transmission layer 21 and the high transmission layer 22 are formed by sputtering. Any type of sputtering such as DC sputtering, RF sputtering, and ion beam sputtering can be used. In the case of using a target having low conductivity (such as a silicon target, a silicon compound target containing no or having a small content of a semimetal element), RF sputtering or ion beam sputtering is preferably used. In consideration of a film forming rate, RF sputtering is more preferably used.

A method of manufacturing the mask blank 100 preferably includes a low transmission layer formation step of forming the low transmission layer 21 by reactive sputtering in a sputtering gas containing nitrogen-based gas and a noble gas using a silicon target or a target made of a material containing one or more elements selected from semimetal elements and non-metal elements incorporated in silicon, and a high transmission layer formation step of forming the high transmission layer 22 by sputtering in a sputtering gas containing a noble gas using a silicon dioxide ($SiO_2$) target or a target made of a material containing one or more elements selected from semimetal elements and non-metal elements incorporated in silicon dioxide ($SiO_2$)). The high transmission layer 22 can also be formed by reactive sputtering in a sputtering gas containing oxygen gas and a noble gas using a silicon target or a target made of a material containing one or more elements selected from semimetal elements and non-metal elements incorporated in silicon.

When the low transmission layer 21 is formed of a material having a nitrogen content of 50 atom % or more, the sputtering gas used in the low transmission layer formation step can be selected to be in a so-called poisoning mode (reactive mode). In the poisoning mode, a mixing ratio of nitrogen gas is larger than the range of a mixing ratio of nitrogen gas that is in a transition mode having a tendency to make film formation unstable.

As the nitrogen-based gas used in the low transmission layer formation step, any gas can be used as long as the gas is a gas containing nitrogen. As described above, since the low transmission layer 21 preferably has a low oxygen content, nitrogen-based gas containing no oxygen is preferably used, and nitrogen gas ($N_2$ gas) is more preferably used. As the noble gas used in the low transmission layer formation step and the high transmission layer formation step, any noble gas can be used. Preferable examples of the noble gas include argon, krypton, and xenon. Additionally, to relax a stress of a thin film, helium and neon having a small atomic weight can be incorporated positively in the thin film.

The mask blank 100 preferably includes the light shielding film 3 on the phase shift film 2. Generally, at an outer peripheral region of a region (transfer pattern formation region) where a transfer pattern is formed, a phase shift mask 200 (see FIGS. 2A to 2F) is required to secure an optical density (OD) of a predetermined value or more. This is for the purpose of preventing a resist film from being influenced by exposure light having passed through an outer peripheral region during transfer by exposure to the resist film on a semiconductor substrate using an exposure apparatus. At the outer peripheral region of the phase shift mask 200, the phase shift mask 200 is at least required to have an optical density of more than 2.0. As described above, the phase shift film 2 has a function of transmitting exposure light at a predetermined transmittance. It is difficult to secure the aforementioned optical density by the phase shift film 2 alone. Therefore, to secure a deficient optical density, it is desirable that the light shielding film 3 be stacked on the phase shift film 2 in a stage of manufacturing the mask blank 100. According to the configuration of such a mask blank 100, the phase shift mask 200 having the aforementioned optical density at the outer peripheral region can be manufactured by removing the light shielding film 3 of a region where a phase shift effect is used (basically, a transfer pattern formation region) during manufacturing of the phase shift film 2. Note that an optical density of a stacked structure of the phase shift film 2 and the light shielding film 3 in the mask blank 100 is preferably 2.5 or more, and more preferably 2.8 or more. Additionally, from the viewpoint of decreasing a thickness of the light shielding film 3, the optical density of the stacked structure of the phase shift film 2 and the light shielding film 3 is preferably 4.0 or less.

The light shielding film 3 can include any of a single layer structure and a stacked structure of two or more layers. Additionally, the light shielding film 3 including a single layer structure and each layer of the light shielding film 3 including a stacked structure of two or more layers may be configured to have substantially the same composition in a film or layer thickness direction, or may be configured to have gradient composition in the layer thickness direction.

When no other film is interposed between the light shielding film and the phase shift film 2, a material having sufficient etching selectivity with an etching gas used in forming a pattern in the phase shift film 2 needs to be used for the light shielding film 3. In this case, the light shielding film 3 is preferably formed of a chromium-containing material. Examples of the chromium-containing material forming the light shielding film 3 include a chrome metal and a material containing one or more elements selected from oxygen, nitrogen, carbon, boron, and fluorine incorporated in chromium.

A chromium-based material is generally etched with a mixed gas of chlorine-based gas and oxygen gas. However, a chromium metal has a relatively low etching rate with this etching gas. In consideration of increasing the etching rate with the etching gas of the mixed gas of chlorine-based gas and oxygen gas, the material forming the light shielding film 3 is preferably a material containing one or more elements selected from oxygen, nitrogen, carbon, boron, and fluorine incorporated in chromium. Additionally, the chromium-containing material forming the light shielding film 3 may contain one or more elements of indium, molybdenum, and tin. When the chromium-containing material forming the light shielding film 3 contains one or more elements of indium, molybdenum, and tin, an etching rate with the mixed gas of chlorine-based gas and oxygen gas can be further enhanced.

On the other hand, when another film is interposed between the light shielding film 3 and the phase shift film 2 in the mask blank 100, it is preferable that such another film (acts as an etching stopper and as an etching mask film) be formed of the aforementioned chromium-containing material and the light shielding film 3 be formed of a silicon-containing material. The chromium-containing material is etched with the mixed gas of chlorine-based gas and oxygen gas. A resist film formed of an organic material is easily etched with this mixed gas. The silicon-containing material is generally etched with fluorine-based gas or chlorine-based gas. Since these etching gases basically contain no oxygen, a decrease in an amount of a resist film formed of an organic material in etching with these etching gases can be suppressed as compared with in etching with the mixed gas of chlorine-based gas and oxygen gas. Therefore, a film thickness of the resist film can be reduced.

The silicon-containing material forming the light shielding film 3 may contain a transition metal or a metal element other than a transition metal. When the phase shift mask 200 is manufactured from this mask blank 100, a pattern formed in the light shielding film 3 is basically a pattern including a light shielding band at the outer peripheral region. This is because the region has a cumulative irradiation amount of ArF exposure light smaller than a cumulative irradiation amount of ArF exposure light at the transfer pattern formation region, and the light shielding film 3 is rarely left in a fine pattern, and even when ArF light fastness is low, a substantial problem is less likely to occur. Additionally, this is because the light shielding film 3 contains a transition metal, the light shielding film 3 has more improved light shielding performance than light shielding performance of the light shielding film 3 containing no transition metal, and a thickness of the light shielding film can be made small. Examples of the transition metal to be contained in the light shielding film 3 include any one of metals such as molybdenum (Mo), tantalum (Ta), tungsten (W), titanium (Ti), chromium (Cr), hafnium (Hf), nickel (Ni), vanadium (V), zirconium (Zr), ruthenium (Ru), rhodium (Rh), niobium (Nb), and palladium (Pd), and alloys of these metals.

On the other hand, the silicon-containing material forming the light shielding film 3 may be a material consisting of silicon and nitrogen, or a material containing one or more elements selected from semimetal elements and non-metal elements incorporated into a material consisting of silicon and nitrogen.

In the mask blank 100 including the light shielding film 3 stacked on the phase shift film 2, it is more preferable that a hard mask film 4 formed of a material having etching select the etching gas used in etching the light shielding film 3 is further stacked on the light shielding film 3. Since the light shielding film 3 needs to have a function of securing a predetermined optical density, a thickness of the light shielding film 3 has a lower limit value. The hard mask film 4 has a film thickness sufficient to be capable of functioning as an etching mask until completing dry etching performed to form a pattern in the light shielding film 3 located immediately under the hard mask film 4. A thickness of the hard mask film 4 is not basically limited to any thickness in terms of optical characteristics. Therefore, the thickness of the hard mask film 4 can be made significantly smaller than the thickness of the light shielding film 3. Then, the resist film made of an organic material has a film thickness sufficient to be capable of functioning as an etching mask until completing dry etching performed to form a pattern in this hard mask film 4. Thus, the thickness of the resist film can be made significantly smaller than the thickness of a known resist film.

When the light shielding film 3 is formed of the chromium-containing material, this hard mask film 4 is preferably formed of the aforementioned silicon-containing material. Note that in this case, the hard mask film 4 tends to have low adhesion to the resist film made of an organic material. Thus, a surface of the hard mask film 4 is preferably subjected to hexamethyldisilazane (HMDS) treatment to improve adhesion of the surface. Note that the hard mask film 4 in this case is more preferably formed of $SiO_2$, SiN, SiON, or the like. Additionally, as a material for the hard mask film 4 used when the light shielding film 3 is formed of the chromium-containing material, a tantalum-containing material can also be used, in addition to the aforementioned materials. Examples of the tantalum-containing material include a tantalum metal, and a material containing one or more elements selected from nitrogen, oxygen, boron, and carbon incorporated into tantalum. Examples of the tantalum-containing material include Ta, TaN, TaON, TaBN, TaBON, TaCN, TaCON, TaBCN, and TaBOCN. On the other hand, when the light shielding film 3 is formed of the silicon-containing material, the hard mask film 4 is preferably formed of the aforementioned chromium-containing material.

In the mask blank 100, an etching stopper film made of a material having etching selectivity (the aforementioned chromium-containing material including Cr, CrN, CrC, CrO, CrON, and CrC) may be formed with the transparent substrate 1 and the phase shift film 2 between the transparent substrate 1 and the phase shift film 2. Note that this etching stopper film may be formed of an aluminum-containing material.

In the mask blank 100, a resist film made of an organic material and having a film thickness of 100 nm or less is preferably formed in contact with the surface of the hard mask film 4. In the case of a fine pattern supporting the hp 32 nm generation of DRAMs, a Sub-Resolution Assist Feature (SRAF) having a line width of 40 nm may be provided on a transfer pattern (phase shift pattern) to be formed in the hard mask film 4. However, since even in such a case, an aspect ratio of a cross section of a resist pattern can be as low as 1:2.5, collapsing or peeling off of the resist pattern during development, rinsing, or the like of the resist film can be suppressed. Note that a film thickness of the resist film is more preferably 80 nm or less.

FIGS. 2A to 2F are schematic cross-sectional views illustrating steps in manufacturing the phase shift mask 200 from the mask blank 100 according to the embodiment of the present invention.

The phase shift mask 200 of the present invention is a phase shift mask including the phase shift film 2 having a transfer pattern (phase shift pattern 2a) on the transparent substrate 1. The phase shift film 2 has a function of transmitting ArF exposure light at a transmittance of 20% or more. The phase shift film 2 includes a structure having two or more sets of a stacked structure, each set including the low transmission layer 21 and the high transmission layer 22 disposed in order from the transparent substrate 1 side. The low transmission layer 21 is formed of a material containing silicon and nitrogen and having a nitrogen content of 50 atom % or more. The high transmission layer 22 is formed of a material containing silicon and oxygen and having an oxygen content of 50 atom % or more. The high transmission layer 22 provided at an uppermost position is thicker than the high transmission layer 22 provided at a position other than the uppermost position. The low transmission layer 21 is thicker than the high transmission layers 22 provided at a position other than the uppermost position.

Additionally, the phase shift mask 200 of the present invention is a phase shift mask including the phase shift film 2 including a transfer pattern (phase shift pattern 2a) on the transparent substrate 1. The phase shift film 2 has a function of transmitting ArF exposure light at a transmittance of 20% or more. The phase shift film 2 includes a structure having two or more sets of a stacked structure, each set including the low transmission layer 21 and the high transmission layer disposed in order from the transparent substrate 1 side. The low transmission layer 21 is formed of a material containing silicon and nitrogen. The high transmission layer 22 is formed of a material containing silicon and oxygen. The low transmission layer 21 has a content of nitrogen larger than a content of nitrogen of the high transmission layer 22. The high transmission layer 22 has a content of oxygen larger than a content of oxygen of the low transmission layer 21. The high transmission layer 22 provided at the uppermost position is thicker than the high transmission layer 22 provided at a position other than the uppermost position. A thickness of the low transmission layer is larger than a thickness of the high transmission layer 22 provided at a position other than the uppermost position.

The phase shift mask 200 has the same technical features as those of the mask blank 100. Matters related, to the transparent substrate 1, and the low transmission layer 21 and the high transmission layer 22 of the phase shift film 2, and matters related to the light shielding film 3 in the phase shift mask 200 are the same as those in the mask blank 100.

Additionally, in a method of manufacturing the phase shift mask 200 of the present invention, the aforementioned mask blank 100 is used. The method includes the steps of: forming a transfer pattern in the light shielding film 3 by dry etching; forming a transfer pattern in the phase shift film 2 by dry etching using as a mask the light shielding film 3 (light shielding pattern 3a) having the transfer pattern; and forming a pattern (light shielding pattern 3b) including a light shielding band in the light shielding film 3 (light shielding pattern 3a) by dry etching using as a mask a resist film (resist pattern 6b) having a pattern including a light shielding band.

In such a phase shift mask 200, when a transfer pattern is transferred by exposure to a resist film on a semiconductor substrate, a phase shift effect at a boundary between the transfer pattern and the resist film becomes significant, and contrast of transfer image can be enhanced.

Therefore, when the phase shift mask 200 is set on a mask stage of an exposure apparatus using an ArF excimer laser as exposure light and the phase shift pattern 2a is transferred by exposure to a resist film on a semiconductor substrate, the pattern can be transferred to the resist film on the semiconductor substrate with precision sufficiently satisfying design specifications. For example, a fine pattern such as a contact hole can also be easily transferred to a resist film on a semiconductor substrate by Negative Tone Development (NTD).

Hereinafter, the method of manufacturing the phase shift mask 200 will be described as an example in accordance with the manufacturing steps illustrated in FIGS. 2A to 2F. Note that in this example, a chromium-containing material is used for the light shielding film 3 and a silicon-containing material is used for the hard mask film 4.

A resist film is first formed to be in contact with the hard mask film 4 in the mask blank 100 by a spin coating method. Next, a first pattern being a transfer pattern (phase shift pattern) to be formed in the phase shift film 2 is exposure-drawn on the resist film, and predetermined treatment such as development treatment is further performed to form a first resist pattern 5a having the phase shift pattern (see FIG. 2A). Subsequently, the hard mask film 4 is dry etched using fluorine-based gas and using the first resist pattern 5a as a mask, to form the first pattern (hard mask pattern 4a) in the hard mask film 4 (see FIG. 2B).

Figure 2A:
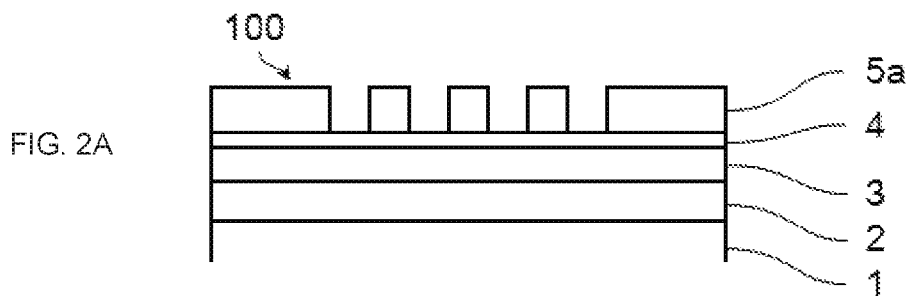
FIGS. 2A to 2F are cross-sectional views illustrating steps in manufacturing a transfer mask according to embodiment of the present invention.
Figure 2B:
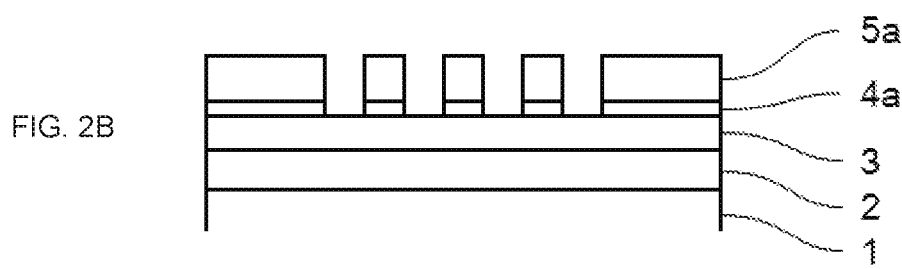
Figure 2C:

Next, the first resist pattern 5a is removed, and the light shielding film is then dry etched using a mixed gas of chlorine-based gas and oxygen gas and using the hard mask pattern 4a as a mask, to form a first pattern (light shielding pattern 3a) in the light shielding film 3 (see FIG. 2C). Subsequently, the phase shift film 2 is dry etched using fluorine-based gas and using the light shielding pattern 3a as a mask, to form a first pattern (phase shift pattern 2a) in the phase shift film 2 and simultaneously remove the hard mask pattern 4a (see FIG. 2D).

Next, a resist film is formed on the mask blank 100 by a spin coating method. Next, a second pattern being a pattern (light shielding pattern) including a light shielding band to be formed in the light shielding film 3 is exposure-drawn, and predetermined treatment such as development treatment is further performed to form a second resist pattern 6b having a light shielding pattern. Subsequently, the light shielding film 3 is dry etched using a mixed gas of chlorine-based gas and oxygen gas and using the second resist pattern 6b as a mask, to form a second pattern (light shielding pattern 3b) in the light shielding film 3 (see FIG. 2E). Further, the second resist pattern 6b is removed, and predetermined treatment such as cleaning is performed to obtain the phase shift mask 200 (see FIG. 2F). The phase shift pattern 200 obtained is a favorable phase shift pattern having a small level difference in a pattern side wall of the phase shift pattern 2a.

The aforementioned chlorine-based gas used in dry etching is not particularly limited as long as the gas contains chlorine (Cl). Examples of the chlorine-based gas include $Cl_2$, $SiCl_2$, $CHCl_3$, $CH_2Cl_2$, $CCl_4$, and $BCl_3$. Additionally, the aforementioned fluorine-based gas used in dry etching is not particularly limited as long as the gas contains fluorine (F). Examples of the fluorine-based gas include $CHF_3$, $CF_4$, $C_2F_6$, $C_4F_8$, and $SF_6$. In particular, an etching rate of the transparent substrate 1 made of a glass material with fluorine-based gas containing no carbon (C) is relatively low, and thus damage on the transparent substrate 1 can further be reduced.

Further, a method of manufacturing a semiconductor device of the present invention includes transferring by exposure a pattern to a resist film on a semiconductor substrate using the aforementioned phase shift mask 200 or the aforementioned transfer mask 200 manufactured using the aforementioned mask blank 100.

The phase shift mask 200 and the mask blank 100 of the present invention have the aforementioned effects. Thus, even when the phase shift mask 200 is set on a mask stage of an exposure apparatus using an ArF excimer laser as exposure light and the phase shift pattern 2a is transferred by exposure to a resist film on a semiconductor substrate, the pattern can be transferred to the resist film on the semiconductor substrate with precision sufficiently satisfying design specifications. For example, a fine pattern such as a contact hole can also be easily transferred to a resist film on a semiconductor substrate by NTD. Therefore, when an underlayer film is dry etched using the pattern of the resist film as a mask to form a circuit pattern, the formed circuit pattern can have high accuracy without having a short circuit nor disconnection of wiring due to insufficient accuracy.

EXAMPLES

Hereinafter, embodiments of the present invention will be described more specifically by way of examples.

Simulation

A phase shift film including a two-layer structure consisting of a low transmission layer made of a silicon nitride-based material and a high transmission layer made of a silicon oxide-based material disposed in order from a transparent substrate side was subjected to simulation to determine an optimal thickness of each of the low transmission layer and the high transmission layer. In the simulation, a target phase difference was within the range of 177±0.5°. Additionally, in the simulation, a target transmittance was within each of the ranges of 22±2%, 30±2%, and 36±2%. Additionally, the simulation was performed under conditions including a refractive index n of the low transmission layer of 2.58, an extinction coefficient k of the low transmission layer of 0.36, a refractive index n of the high transmission layer of 1.59, and an extinction coefficient k of the high transmission layer of 0.00. Additionally, the simulation was performed under conditions where ArF exposure light perpendicularly enters the phase shift film.

In the case of performing the simulation in which the target transmittance was within the range of 22±2%, a transmittance was 21.8% and a phase difference was 177.0° in the real simulation. The thickness of the low transmission layer determined by the simulation was 58.5 nm, and the thickness of the high transmission layer was 11.0 nm.

In the se of performing the simulation in which the target transmittance was within the range of 30±2%, a transmittance was 29.1% and a phase difference was 177.1° in the real simulation. A thickness of the low transmission layer determined by the simulation was 52.0 nm, and the thickness of the high transmission layer was 25.5 nm.

In the case of performing the simulation in which the target transmittance was within the range of 36±2%, a transmittance was 36.0% and a phase difference was 176.9° in the real simulation. The thickness of the low transmission layer determined by the simulation was 38.0 nm, and the thickness of the high transmission layer was 61.0 nm.

Example 1

In Example 1, a case where a phase shift film 2 includes a structure having two sets of a stacked structure, each set consisting of a low transmission layer 21 and a high transmission layer 22 and a target transmittance is 22±2% will be described.

Manufacture of Mask Blank

A transparent substrate 1 having a main surface dimension of approximately 152 mm×approximately 152 mm and a thickness of approximately 6.25 mm and made of synthetic quartz glass was prepared. An end surface and the main surface of this transparent substrate 1 were polished to have predetermined surface roughness and then subjected to predetermined washing treatment and drying treatment.

Next, the transparent substrate 1 was installed in a single-wafer RF sputtering apparatus, and a low transmission layer 21 made of silicon and nitrogen (Si:N=44 atom %:56 atom %) and having a thickness of 29.3 nm was formed on the transparent substrate 1 by reactive sputtering (RF sputtering) using a silicon (Si) target and a mixed gas of krypton (Kr), helium (He), and nitrogen ($N_2$) (flow rate ratio Kr:He:$N_2$=1:10:3, pressure: 0.09 Pa) as a sputtering gas at electric power of an RF power supply of 2.8 Kw. On a main surface of another transparent substrate, only a low transmittance layer 21 was formed under the same conditions. Optical properties of this low transmittance layer 21 were measured using a spectral ellipsometer (M-2000D manufactured by J. A. Woollam Inc.). As a result, a refractive index n at a wavelength of 193 nm was 2.58 and an extinction coefficient k at a wavelength of 193 nm was 0.36. The thickness of the low transmission layer 21 obtained after film formation can be confirmed by a measurement device (e.g., GXR-300 manufactured by Rigaku Corporation) using X-ray reflectivity (XRR). Film thicknesses of other films can be confirmed similarly.

Note that as for the conditions used in forming the low transmission layer 21, relationship between a flow rate ratio of $N_2$ gas in a mixed gas of Kr gas, He gas, and $N_2$ gas as a sputtering gas and a deposition rate is verified in advance by the single-wafer RF sputtering apparatus used, and film formation conditions such as a flow rate ratio enabling stable film formation at a region of poisoning mode (reactive mode) are selected, Additionally, the composition of the low transmission layer 21 was as a result of measurement by an X-ray photoelectron spectroscopy (XPS). Hereinafter, the same applies to other films.

Next, the transparent substrate 1 on which the low transmittance layer 21 was stacked was installed in a single-wafer RF sputtering apparatus, and a high transmission layer 22 made of silicon and oxygen (Si:O=34 atom %:66 atom %) and having a thickness of 1.5 nm was formed on the low transmission layer 21 by RF sputtering using a silicon dioxide ($SiO_2$) target and using argon (Ar) gas (pressure: 0.03 Pa) as a sputtering gas at electric power of an RF power supply of 1.5 kW. On a main surface of another transparent substrate, only a high transmittance layer 22 was formed under the same conditions. Optical properties of this high transmittance layer 22 were measured using a spectral ellipsometer (M-2000D manufactured by J. A. Woollam Co., Inc.). As a result, a refractive index n at a wavelength of 193 nm was 1.59 and an extinction coefficient k at a wavelength of 193 nm was 0.00.

Next, the transparent substrate 1 on which the low transmission layer 21 and the high transmission layer 22 were stacked in this order was installed in a single-wafer RE sputtering apparatus. A low transmission layer 21 having a thickness of 29.3 nm was formed on the high transmission layer 22 under the same conditions as the conditions in the formation of the low transmission layer 21. Composition and optical properties of the low transmission layer 21 formed are the same as the composition and optical properties of the aforementioned low transmission layer 21.

Next, the transparent substrate 1 on which the low transmission layer 21, the high transmission layer 22, and the low transmission layer 21 were stacked in this order was installed in a single-wafer RF sputtering apparatus. A high transmission layer 22 having a thickness of 9.5 nm was formed on the low transmission layer 21 under the same conditions as the conditions in the formation of the high transmission layer 22. Composition and optical properties of the high transmission layer 22 formed are the same as the composition and optical properties of the aforementioned high transmission layer 22.

According to the aforementioned procedure, the phase shift film 2 having the total film thickness of 69.6 nm was formed on the transparent substrate 1. The phase shift film 2 had two sets of a stacked structure, each set consisting of the low transmission layer 21 and the high transmission layer 22 stacked in this order, a thickness of the high transmission layer 22 provided at an uppermost position was larger than a thickness of the high transmission layer 22 provided at a position other than the uppermost position, and a thickness of the low transmission layer 21 was larger than a thickness of the high transmission layer 22 provided at a position other than the uppermost position.

Next, the transparent substrate 1 on which the phase shift film 2 was formed was subjected to heating treatment under conditions of a heating temperature of 500° C. and treatment time of 1 hour in air. A transmittance and a phase difference at a wavelength of light of an ArF excimer laser (approximately 193 nm) of the phase shift film 2 obtained after the heating treatment were measured by a phase shift measurement system (MPM-193 manufactured by Lasertec Corporation). As a result, the transmittance was 21.0% and the phase difference was 176.8°.

Next, the transparent substrate 1 on which the phase shift film 2 obtained after the heating treatment was formed was installed in a single-wafer DC sputtering apparatus. A light shielding film 3 made of CrOC (Cr: 71 atom %, O: 15 atom %, C: 14 atom %) and having a thickness of 56 nm was formed to be in contact with a surface of the phase shift film 2 by reactive sputtering (DC sputtering) using a chromium (Cr) target and using a mixed gas of argon (Ar), carbon dioxide ($CO_2$), and helium (He) as a sputtering gas at electric power of a DC power supply of 1.8 kW.

An optical density at a wavelength of light of an ArF excimer laser (approximately 193 nm) of the stacked structure of the phase shift film 2 and the light shielding film 3 stacked on the transparent substrate 1 was measured using a spectrophotometer (Cary4000 manufactured by Agilent Technologies). As a result, the optical density was able to be confirmed to be 3.0 or more.

Further, the transparent substrate 1 on which the phase shift film 2 and the light shielding film 3 were stacked was installed in a single-wafer RF sputtering apparatus, and a hard mask film 4 made of silicon and oxygen and having a thickness of 5 nm was formed on the light shielding film 3 by RF sputtering using a silicon dioxide ($SiO_2$) target and using argon (Ar) gas (pressure: 0.03 Pa) as a sputtering gas at electric power of an RF power supply of 1.5 kW.

A mask blank 100 of Example 1 including a structure where the phase shift film including a four-layer structure, the light shielding film 3, and the hard mask film 4 were stacked on the transparent substrate 1 was manufactured according to the aforementioned procedure.

Manufacture of Phase Shift Mask

Next, this mask blank 100 of Example 1 was used to make a phase shift mask 200 of Example 1 according to the following procedure.

First, a surface of the hard mask film 4 was subjected to HMDS treatment. Subsequently, a resist film made of a chemically amplified resist for electron beam lithography and having a film thickness of 80 nm was formed to be in contact with the surface of the hard mask film 4 by a spin coating method. Next, a first pattern being a phase shift pattern to be formed in the phase shift film 2 was drawn by an electron beam on the resist film, and predetermined development treatment and cleaning treatment were performed to form a first resist pattern 5a having the first pattern (see FIG. 2A).

Next, the hard mask film 4 was dry etched with $CF_4$ gas using the first resist pattern 5a as a mask to form the first pattern (hard mask pattern 4a) in the hard mask film 4 (see FIG. 2B).

Next, the first resist pattern 5a was removed. Subsequently, shielding film 3 was dry etched with a mixed gas of chlorine and oxygen (gas flow rate ratio $Cl_2$:$O_2$=13:1) using the hard mask pattern 4a as a mask to form a first pattern (light shielding pattern 3a) in the light shielding film 3 (see FIG. 2C).

Figure 2D:
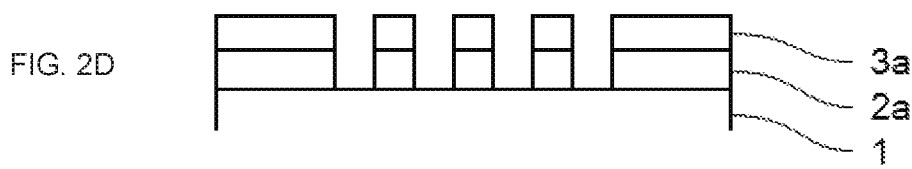
Figure 2E:
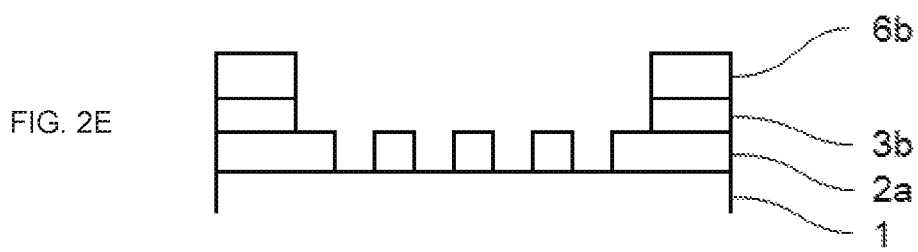
Figure 2F:
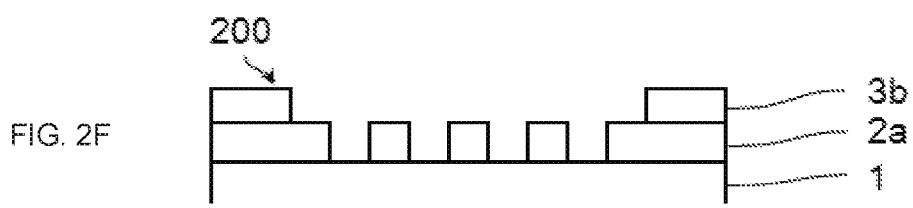

Next, the phase shift film 2 was dry etched with fluorine-based gas (mixed gas of $SF_6$ and He) using the light shielding pattern 3a as a mask to form a first pattern (phase shift pattern 2a) in the phase shift film 2 and simultaneously remove the hard mask pattern 4a (see FIG. 2D).

Next, a resist film made of a chemically amplified resist for electron beam lithography and having a film thickness of 150 nm was formed on the light shielding pattern 3a by a spin coating method. Next, a second pattern being a pattern (light shielding pattern) including a light shielding band to be formed in the light shielding film 3 was exposure-drawn on the resist film, and predetermined, treatment such as development treatment was further performed to form a second resist pattern 6b having the light shielding pattern. Subsequently, the light shielding film 3 was dry etched with a mixed gas of chlorine and oxygen (gas flow rate ratio Cl$_2$:O$_2$=4:1) using the second resist pattern 6*b* as a mask to form a second pattern (light shielding pattern 3*b*) in the light shielding film 3 (see FIG. 2E). Further, the second resist pattern 6*b* was removed, and predetermined treatment such as cleaning was performed to obtain the phase shift mask 200 (see FIG. 2F). The obtained phase shift pattern 200 was a favorable phase shift pattern having a small level difference in a pattern side wall of the phase shift pattern 2*a*.

The phase shift mask 200 of Example 1 was subjected to a simulation of a transfer image transferred by exposure to a resist film on a semiconductor substrate with exposure light having a wavelength of 193 nm using AIMS193 (manufactured by Carl Zeiss).

According to verification of the transfer image transferred by exposure in this simulation, design specifications were sufficiently satisfied. It can be said from this result that even when the phase shift mask 200 of Example 1 is set on a mask stage of an exposure apparatus and transferred by exposure to the resist film on the semiconductor substrate, a circuit pattern finally formed on a semiconductor device can be formed with high precision.

Comparative Example 1

In Comparative Example 1, a case where a phase shift film includes a structure having two sets of a stacked structure, each set consisting of a low transmission layer and a high transmission layer and a target transmittance is 22±2% will be described.

Manufacture of Mask Blank

A mask blank of Comparative Example 1 was manufactured according to the same procedure as the procedure for the mask blank 100 of Example 1 except that a phase shift film was changed. Specifically, in the phase shift film of Comparative Example 1, a thickness of the low transmission layer was 29.3 nm and each of a thickness of the high transmission layer provided at an uppermost position and a thickness of the high transmission layer provided at a position other than the uppermost position was 5.5 nm. That is, the phase shift film having the total film thickness of 69.6 nm was formed on a transparent substrate. The phase shift film included two sets of a stacked structure, each set consisting of the low transmission layer and the high transmission layer stacked in this order, the thicknesses of the low transmission layers were the same as each other in the two sets of a stacked structure, and the thicknesses of the high transmission layers were the same as each other in the two sets of a stacked structure.

Similarly, in Comparative Example 1, the transparent substrate on which the phase shift film was formed was subjected to heating treatment in the same manner as in Example 1. A transmittance and a phase difference at a wavelength of light of an ArF excimer laser (approximately 193 nm) of the phase shift film obtained after the heating treatment were measured in the same manner as in Example 1. The transmittance was 19.0% and the phase difference was 176.5°. The transmittance of the phase shift film of Comparative Example 1 largely decreased to be out of the target transmittance range.

The mask blank of Comparative Example 1 including a structure where the phase shift film including a four-layer structure, the light shielding film, and the hard mask film were stacked on the transparent substrate was manufactured according to the aforementioned procedure.

Manufacture of Phase Shift Mask

Next, this mask blank of Comparative Example 1 was used to manufacture a phase shift mask of Comparative Example 1 according to the same procedure as in Example 1.

The phase shift mask of Comparative Example 1 was subjected to simulation of a transfer image transferred by exposure to a resist film on a semiconductor substrate with exposure light having a wavelength of 193 nm in the same manner as in Example 1.

The exposure transfer image in this simulation was verified. As a result, the transmittance of the phase shift film of Comparative Example 1 largely decreased to be out of the target transmittance range, and thus insufficient contrast of the transfer image was found at a location of a fine pattern as compared with Example 1. It is expected from the result that when the phase shift mask of Comparative Example 1 is set on a mask stage of an exposure apparatus and transferred by exposure to a resist film on a semiconductor substrate, disconnection and a short circuit of a circuit pattern finally formed on a semiconductor device may occur.

Example 2

In Example 2, a case where a phase shift film 2 includes a structure having two sets of a stacked structure, each set consisting of a low transmission layer 21 and a high transmission layer 22 and a target transmittance is 30±2% will be described.

Manufacture of Mask Blank

A mask blank 100 of Example 2 was manufactured according to the same procedure as the procedure for the mask blank 100 of Example 1 except that a phase shift film 2 and a light shielding film 3 were changed. Specifically, in the phase shift film 2 of Example 2, a thickness of the low transmission layer 21 was 26.0 nm, a thickness of the high transmission layer 22 provided at an uppermost position was 24.0 nm, and a thickness of the high transmission layer 22 provided at a position other than the uppermost position was 1.5 nm. That is, the phase shift film 2 having the total film thickness of 77.5 nm was formed on a transparent substrate 1. The phase shift film 2 includes two sets of a stacked structure, each set consisting of the low transmission layer 21 and the high transmission layer 22 stacked in this order, a thickness of the high transmission layer 22 provided at the uppermost position was larger than a thickness of the high transmission layer 22 provided at a position other than the uppermost position, and a thickness of the low transmission layer 21 was larger than a thickness of the high transmission layer 22 provided at a position other than the uppermost position.

Similarly, in the of Example 2, the transparent substrate 1 on which the phase shift film 2 was formed was subjected to heating treatment in the same manner as in Example 1. A transmittance and a phase difference at a wavelength of light of an ArF excimer laser (approximately 193 nm) of the phase shift film 2 obtained after the heating treatment were measured in the same manner as in Example 1. As a result, the transmittance was 28.1% and the phase difference was 176.5°.

Additionally, in Example 2, a thickness of the light shielding film 3 was changed to 58 nm. An optical density at a wavelength of light of an ArF excimer laser (approximately 193 nm) of the stacked structure including the phase shift film 2 and the light shielding film 3 stacked on the transparent substrate 1 of Example 2 was measured by a spectrophotometer (Cary4000 manufactured by Agilent Technologies). As a result, the optical density was able to be confirmed to be 3.0 or more.

The mask blank 100 in Example 2 including a structure where the phase shift film 2 including a four-layer structure, the light shielding film 3, and the hard mask film 4 stacked on the transparent substrate 1 was manufactured according to the aforementioned procedure.

Manufacture of Phase Shift Mask

Next, this mask blank 100 of Example was used to manufacture the phase shift mask 100 of Example 2 according to the same procedure as in Example 1.

The phase shift mask 200 of Example 2 was subjected to simulation of a transfer image transferred by exposure to a resist film on a semiconductor substrate with exposure light having a wavelength of 193 nm in the same manner as in Example 1.

According to verification of the transfer image transferred by exposure in this simulation, design specifications were sufficiently satisfied. It can be said from these results, even when the phase shift mask 200 of Example 2 is set on a mask stage of an exposure apparatus and transferred by exposure to a resist film on a semiconductor device, a circuit pattern finally formed on the semiconductor device can be formed with high precision.

Comparative Example 2

In Comparative Example 2, a case where a phase shift film includes a structure having two sets of a stacked structure, each set consisting of a low transmission layer and a high transmission layer and a target transmittance is 30±2% will be described.

Manufacture of Mask Blank

A mask blank of Comparative Example 2 was manufactured according to the same procedure as the procedure for the mask blank 100 of Example 2 except that a phase shift film was changed. Specifically, in the phase shift film of Comparative Example 2, thickness of the low transmission layer was 26.0 nm and each of a thickness of the high transmission layer provided at an uppermost position and a thickness of the high transmission layer provided at a position other than the uppermost position was 12.8 nm. That is, the phase shift film having the total thickness of 77.6 nm was formed on a transparent substrate. The phase shift film included two sets of a stacked structure, each set consisting of the low transmission layer and the high transmission layer stacked in this order, thicknesses of the low transmission layers were the same as each other in the two sets of a stacked structure, and thicknesses of the high transmission layers were the same as each other in the two sets of a stacked structure.

Similarly, in the case of Comparative Example 2, the transparent substrate on which the phase shift film was formed was subjected to heating treatment in the same manner as in Example 1. A transmittance and a phase difference at a wavelength of light of an ArF excimer laser (approximately 193 nm) of the phase shift film obtained after the heating treatment were measured in the same manner as in Example 1. The transmittance was 20.7% and the phase difference was 169.7°. The transmittance of the phase shift film of Comparative Example 2 largely decreased to be out of the target transmittance range. The phase difference of the phase shift film of Comparative Example 2 was also largely out of the target phase difference range.

The mask blank of Comparative Example 2 including a structure where the phase shift film including a four-layer structure, the light shielding film, and the hard mask film were stacked on the transparent substrate was manufactured according to the aforementioned procedure.

Manufacture of Phase Shift Mask

Next, this mask blank of Comparative Example 2 is used to manufacture a phase shift mask of Comparative Example 2 according to the same procedure as in Example 1.

The phase shift mask of Comparative Example 2 was subjected to simulation of a transfer image transferred by exposure to a resist film on a semiconductor substrate with exposure light having a wavelength of 193 nm in the same manner as in Example 1.

The transfer image transferred by exposure in this simulation was verified. As a result, the transmittance of the phase shift film of Comparative Example 2 largely decreased to be out of the target transmittance range, and the phase difference was also largely out of the target phase difference range. Thus, insufficient contrast of the transfer image was found at a location of a fine pattern as compared with Example 2. It is expected from the result that, when the phase shift mask of Comparative Example 2 is set on a mask stage of an exposure apparatus and transferred by exposure to a resist film on a semiconductor substrate, disconnection and a short circuit of a circuit pattern finally formed on a semiconductor device may occur.

Example 3

In Example 3, a case where a phase shift film 2 has a structure having four sets of a stacked structure, each set consisting of a low transmission layer 21 and a high transmission layer 22 and a target transmittance is 30±2% will be described.

Manufacture of Mask Blank

A mask blank 100 of Example 3 was manufactured according to the same procedure as the procedure for the mask blank 100 of Example 2 except that a phase shift film 2 was changed. Specifically, the phase shift film 2 of Example 3 included four sets of a stacked structure, each set consisting of the low transmission layer 21 and the high transmission layer 22, a thickness of the low transmission layer 21 was 13.0 nm, a thickness of the high transmission layer 22 provided at an uppermost position was 22.5 nm, and a thickness of the high transmission layer 22 provided at a position other than the uppermost position was 1.0 nm. That is, the phase shift film 2 having the total thickness of 77.5 nm was formed on a transparent substrate 1. The phase shift film 2 included four sets of a stacked structure, each set consisting of the low transmission layer 21 and the high transmission layer 22 stacked in this order, a thickness of the high transmission layer 22 provided at the uppermost position was larger than a thickness of the high transmission layer 22 provided at a position other than the uppermost position, and a thickness of the low transmission layer 21 was larger than a thickness of the high transmission layer 22 provided at a position other than the uppermost position.

Similarly, in Example 3, the transparent substrate 1 on which the phase shift film 2 was formed was subjected to heating treatment in the same manner as in Example 1. A transmittance and a phase difference at a wavelength of light of an ArF excimer laser (approximately 193 nm) of the phase shift film 2 obtained after the heating treatment were measured in the same manner as in Example 1. As a result, the transmittance was 28.0% and the phase difference was 177.0°.

The mask blank 100 in Example 3 including a structure where the phase shift film 2 including an eight-layer structure, the light shielding film 3, and the hard mask film 4 were stacked on the transparent substrate 1 was manufactured according to the aforementioned procedure.

Manufacture of Phase Shift Mask

Next, this mask blank 100 of Example 3 is used to manufacture a phase shift mask 200 of Example 3 according to the same procedure as in Example 1.

The phase shift mask 200 of Example 3 was subjected to simulation of a transfer image transferred by exposure to a resist film on a semiconductor substrate with exposure light having a wavelength of 193 nm in the same manner as in Example 1.

According to verification of the transfer image transferred by exposure in this simulation, design specifications were sufficiently satisfied. It can be said from the result, even when the phase shift mask 200 of Example 3 is set on a mask stage of an exposure apparatus and is transferred by exposure to a resist film on a semiconductor substrate, a circuit pattern finally formed on a semiconductor device can be formed with high precision.

Comparative Example 3

In Comparative Example 3, a case where a phase shift film includes a structure having four sets of a stacked structure, each set consisting of a low transmission layer and a high transmission layer and a target transmittance is 30±2% will be described.

Manufacture of Mask Blank

A mask blank of Comparative Example 3 was manufactured according to the same procedure as the procedure for the mask blank 100 of Example 2 except that a phase shift film was changed. Specifically, the phase shift film of Comparative Example 3 had four sets of a stacked structure, each set consisting of the low transmission layer and the high transmission layer, a thickness of the low transmission layer was 13.0 nm, and each of a thickness of the high transmission layer provided at an uppermost position and a thickness of the high transmission layer provided at a position other than the uppermost position was 6.4 nm. That is, the phase shift film having the total thickness of 77.6 nm was formed on a transparent substrate. The phase shift film had four sets of a stacked structure, each set consisting of the low transmission layer and the high transmission layer in this order, the thicknesses of the low transmission layers in the four sets of a stacked structure were the same as each other, and the thicknesses of the high transmission layers in the four sets of a stacked structure were the same as each other.

Similarly, in Comparative Example 3, the transparent substrate on which the phase shift film was formed was subjected to heating treatment in the same manner as in Example 1. A transmittance and a phase difference at a wavelength of light of an ArF excimer laser (approximately 193 nm) of the phase shift film obtained after the heating treatment were measured in the same manner as in Example 1. As a result, the transmittance was 22.0% and the phase difference was 183.6°. The transmittance of the phase shift film of Comparative Example 3 largely decreased to be out of the target transmittance range. The phase difference was also largely out of the target phase difference range.

The mask blank of Comparative Example 3 including a structure where the phase shift film including an eight-layer structure, the light shielding film, and the hard mask film were stacked on the transparent substrate was manufactured according to the aforementioned procedure.

Manufacture of Phase Shift Mask

Next, this mask blank of Comparative Example 3 was used to manufacture a phase shift mask of Comparative Example 3 according to the same procedure as in Example 1.

The phase shift mask of Comparative Example 3 was subjected to simulation of a transfer image transferred by exposure to a resist film on a semiconductor substrate with exposure light having a wavelength of 193 nm in the same manner as in Example 1.

The transfer image transferred by exposure in this simulation was verified. As a result, a transmittance of the phase shift film of Comparative Example 3 largely decreased to be out of the target transmittance range, and the phase difference was also largely out of the target phase difference range. Thus, insufficient contrast of the transfer image was found at a location of a fine pattern as compared with Example 3. It is expected from the result that, when the phase shift mask of Comparative Example 3 is set on a mask stage of an exposure apparatus and transferred by exposure to a resist film on a semiconductor substrate, disconnection and a short circuit of a circuit pattern finally formed on a semiconductor device may occur.

Example 4

In Example 4, a case where a phase shift film 2 includes a structure having two sets of a stacked structure, each set consisting of a low transmission layer 21 and a high transmission layer 22 and a target transmittance is 36±2% will be described.

Manufacture of Mask Blank

A mask blank 100 of Example 4 was manufactured according to the same procedure as the procedure for the mask blank 100 of Example 1 except that a phase shift film 2 and a light shielding film 3 were changed. Specifically, in the phase shift film 2 of Example 4, a thickness of the low transmission layer 21 was 19.0 nm, a thickness of the high transmission layer 22 provided at an uppermost position was 59.0 nm, and a thickness of the high transmission layer 22 provided at a position other than the uppermost position was 1.0 nm. That is, the phase shift film 2 having the total thickness of 98.0 nm was formed on a transparent substrate 1. The phase shift film 2 included two sets of a stacked structure, each set consisting of the low transmission layer 21 and the high transmission layer 22 stacked in this order, the thickness of the high transmission layer 22 provided at the uppermost position was larger than the thickness of the high transmission layer 22 provided at a position other than the uppermost position, and the thickness of the low transmission layer 21 was larger than the thickness of the high transmission layer 22 provided at a position other than the uppermost position.

Similarly, in Example 4, the transparent substrate 1 on which the phase shift film 2 was formed was subjected to heating treatment in the same manner as in Example 1. A transmittance and a phase difference at a wavelength of light of an ArF excimer laser (approximately 193 nm) of the phase shift film 2 obtained after the heating treatment were measured in the same manner as in Example 1. The transmittance was 35.0% and the phase difference was 177.4°.

Additionally, in Example 4, a thickness of the light shielding film 3 was changed to 60 nm. An optical density at a wavelength of light of an ArF excimer laser (approximately 193 nm) of the stacked structure including phase shift film 2 and the light shielding film 3 stacked on the transparent substrate 1 of Example 4 was measured by a spectrophotometer (Cary4000 manufactured by Agilent Technologies). As a result, the optical density was able to be confirmed to be 3.0 or more.

The mask blank in Example 4 including a structure where the phase shift film 2 including a four-layer structure, the light shielding film 3, and a hard mask film 4 were stacked on the transparent substrate 1 was manufactured according to the aforementioned procedure.

Manufacture of Phase Shift Mask

Next, this mask blank 100 of Example 4 was used to manufacture a phase shift mask 200 of Example 4 according to the same procedure as in Example 1.

The phase shift mask 200 of Example 4 was subjected to simulation of a transfer image transferred by exposure to a resist film on a semiconductor substrate with exposure light having a wavelength of 193 nm in the same manner as in Example 1.

According to verification of the transfer image transferred by exposure in this simulation, design specifications were sufficiently satisfied. It can be said from the result that, when the phase shift mask 200 of Example 4 was set on a mask stage of an exposure apparatus and transferred by exposure to a resist film on a semiconductor substrate, a circuit pattern finally formed on a semiconductor device can be formed with high precision.

Comparative Example 4

In Comparative Example 4, a case where a phase shift film includes a structure having two sets of a stacked structure, each set consisting of a low transmission layer and a high transmission layer and a target transmittance is 36±2% will be described.

Manufacture of Mask Blank

A mask blank of Comparative Example 4 was manufactured according to the same procedure as the procedure for the mask blank 100 of Example 4 except that a phase shift film was changed. Specifically, in the phase shift film of Comparative Example 4, thickness of the low transmission layer was 19.0 nm and each of a thickness of the high transmission layer provided at an uppermost position and a thickness of the high transmission layer provided at a position other than the uppermost position was 30.5 nm. That is, the phase shift film having the total thickness of 99.0 nm was formed on a transparent substrate. The phase shift film included two sets of a stacked structure, each set consisting of the low transmission layer and the high transmission layer in this order, the thicknesses of the low transmission layers were the same as each other in the two sets of a stacked structure, and the thicknesses of the high transmission layers were the same as each other in the two sets of a stacked structure.

Similarly, in Comparative Example 4, the transparent substrate on which the phase shift film was formed was subjected to heating treatment in the same manner as in Example 1. A transmittance and a phase difference at a wavelength of light of an ArF excimer laser (approximately 193 nm) of the phase shift film obtained after the heating treatment were measured in the same manner as in Example 1. The transmittance was 28.9% and the phase difference was 170.0°. The transmittance of the phase shift film of Comparative Example 4 largely decreased to be out of the target transmittance range. The phase difference was also largely out of the target phase difference range.

The mask blank of Comparative Example 4 including a structure where the phase shift film including a four-layer structure, the light shielding film, and the hard mask film were stacked on the transparent substrate was manufactured according to the aforementioned procedure.

Manufacture of Phase Shift Mask

Next, this mask blank 100 of Comparative Example 4 was used to manufacture a phase shift mask of Comparative Example 4 according to the same procedure as in Example 1.

The phase shift mask of Comparative Example 4 was subjected to simulation of a transfer image transferred by exposure to a resist film on a semiconductor substrate with exposure light having a wavelength of 193 nm in the same manner as in Example 1.

According to verification of the transfer image transferred by exposure in this simulation, the transmittance of the phase shift film of Comparative Example 4 largely decreased to be out of the target transmittance range, and the phase difference was also largely out of the target phase difference range. Thus, insufficient contrast of the transfer image was found at a location of a fine pattern as compared with Example 4. It is expected from the result that, when the phase shift mask of Comparative Example 4 is set on a mask stage of an exposure apparatus and transferred by exposure to a resist film on a semiconductor substrate, disconnection and a short circuit of a circuit pattern finally formed on a semiconductor device may occur.

Example 5

In Example 5, a case where a phase shift film 2 includes a structure having four sets of a stacked structure, each set consisting of a low transmission layer 21 and a high transmission layer 22 and a target transmittance is 36±2% will be described.

Manufacture of Mask Blank

A mask blank 100 of Example 5 was manufactured according to the same procedure as the procedure for the mask blank 100 of Example 4 except that a phase shift film 2 was changed. Specifically, the phase shift film 2 of Example 5 included four sets of a stacked structure, each set consisting of the low transmission layer 21 and the high transmission layer 22, a thickness of the low transmission layer 21 was 9.4 nm, a thickness of the high transmission layer 22 provided at an uppermost position was 57.0 nm, and a thickness of the high transmission layer 22 provided at a position other than the uppermost position was 1.0 nm. That is, the phase shift film 2 having the total thickness of 97.6 nm was formed on a transparent substrate 1. The phase shift film 2 included four sets of a stacked structure, each set consisting of the low transmission layer 21 and the high transmission layer 22 stacked in this order, the thickness of the high transmission layer 22 provided at the uppermost position was larger than the thickness of the high transmission layer 22 provided at a position other than the uppermost position, and the thickness of the low transmission layer 21 was larger than the thickness of the high transmission layer 22 provided at a position other than the uppermost position.

Similarly, in Example 4, the transparent substrate 1 on which the phase shift film 2 was formed was subjected to heating treatment in the same manner as in Example 1. A transmittance and a phase difference at a wavelength of light of an ArF excimer laser (approximately 193 nm) of the phase shift film 2 obtained after the heating treatment were measured in the same manner as in Example 1. The transmittance was 35.2% and the phase difference was 177.3°.

The mask blank in Example 5 including a structure where the phase shift film 2 including an eight-layer structure, the light shielding film 3, and the hard mask film 4 were stacked on the transparent substrate 1 was manufactured according to the aforementioned procedure.

Manufacture of Phase Shift Mask

Next, this mask blank 100 of Example 5 was used to manufacture a phase shift mask 200 of Example 5 according to the same procedure as in Example 1.

The phase shift mask 200 of Example 5 was subjected to simulation of a transfer image transferred by exposure to a resist film on a semiconductor substrate with exposure light having a wavelength of 193 nm in the same manner as in Example 1.

According to verification of the transfer image transferred by exposure in this simulation, design specifications were sufficiently satisfied. It can be said from the result that, when the phase shift mask 200 of Example 5 was set on a mask stage of an exposure apparatus and transferred by exposure to a resist film on a semiconductor substrate, a circuit pattern finally formed on a semiconductor device can be formed with high precision.

Comparative Example 5

In Comparative Example 5, a case where a phase shift film includes a structure having four sets of a stacked structure, each set consisting of a low transmission layer and a high transmission layer and a target transmittance is 36±2% will be described.

Manufacture of Mask Blank

A mask blank of Comparative Example 5 was manufactured according to the same procedure as the procedure for the mask blank 100 of Example 4 except that a phase shift film was changed. Specifically, the phase shift film of Comparative Example 5 included four sets of a stacked structure, each set consisting of the low transmission layer and the high transmission layer, a thickness of the low transmission layer was 9.5 nm, and each of a thickness of the high transmission layer provided at an uppermost position and a thickness of the high transmission layer provided at a position other than the uppermost position was 15.2 nm. That is, the phase shift film having the total film thickness of 98.8 nm was formed on a transparent substrate. The phase shift film included four sets of a stacked structure, each set consisting of the low transmission layer and the high transmission layer in this order, the thicknesses of the low transmission layers were the same as each other in the four sets of a stacked structure and the thicknesses of the high transmission layers were the same as each other four sets of a stacked structure.

In Comparative Example 5, the transparent substrate on which the phase shift film was formed was subjected to heating treatment in the same manner as in Example 1. A transmittance and a phase difference at a wavelength of light of an ArF excimer laser (approximately 193 nm) of the phase shift film obtained after the heating treatment were measured in the same manner as in Example 1. As a result, the transmittance was 27.1% and the phase difference was 188.2°. The transmittance of the phase shift film of Comparative Example 5 largely decreased to be out of the target transmittance range. The phase difference was also largely out of the target phase difference range.

The mask blank of Comparative Example 5 including a structure where the phase shift film including an eight-layer structure, the light shielding film, and the hard mask film were stacked on the transparent substrate was manufactured according to the aforementioned procedure.

Manufacture of Phase Shift Mask

Next, this mask blank of Comparative Example 5 was used to manufacture a phase shift mask of Comparative Example 5 according to the same procedure as in Example 1.

The phase shift mask of Comparative Example 5 was subjected to simulation of a transfer image transferred by exposure to a resist film on a semiconductor substrate with exposure light having a wavelength of 193 nm in the same manner as in Example 1.

According to verification of the transfer image transferred by exposure in this simulation, the transmittance of the phase shift film of Comparative Example 5 largely decreased to be out of the target transmittance range, and the phase difference was also largely out of the target phase difference range. Thus, insufficient contrast of the transfer image was found at a location of a fine pattern as compared with Example 5. It is expected from the result that, when the phase shift mask of Comparative Example 5 is set on a mask stage of an exposure apparatus and transferred by exposure to a resist film on a semiconductor substrate, disconnection and a short circuit of a circuit pattern finally formed on a semiconductor device may occur.

REFERENCE SIGNS LIST

1 Transparent substrate
2 Phase shift film
2a Phase shift pattern
21 Low transmission layer
22 High transmission layer
3 Light shielding film
3a, 3b Light shielding pattern
4 Hard mask film
4a Hard mask pattern
5a First resist pattern
6b Second resist pattern
100 Mask blank
200 Phase shift mask

The invention claimed is:

1. A mask blank comprising a phase shift film on a transparent substrate, wherein
   the phase shift film has a function of transmitting exposure light of an ArF excimer laser at a transmittance of 20% or more,
   the phase shift film includes a structure having two or more sets of a stacked structure, each set comprising a low transmission layer and a high transmission layer disposed in order from the transparent substrate side,
   the low transmission layer is formed of a material containing silicon and nitrogen and having a nitrogen content of 50 atom % or more,
   the high transmission layer is formed of a material containing silicon and oxygen and having an oxygen content of 50 atom % or more,
   the high transmission layer provided at an uppermost position is thicker than the high transmission layer provided at a position other than the uppermost position, and
   the low transmission layer is thicker than the high transmission layer provided at a position other than the uppermost position.

2. The mask blank according to claim 1, wherein
   the low transmission layer is formed of a material consisting of silicon and nitrogen, or a material consisting of silicon, nitrogen, and one or more elements selected from semimetal elements and non-metal elements, and the high transmission layer is formed of a material consisting of silicon and oxygen, or a material consisting of silicon, oxygen, and one or more elements selected from semimetal elements and non-metal elements.

3. The mask blank according to claim 1, wherein
the low transmission layer is formed of a material consisting of silicon and nitrogen, and
the high transmission layer is formed of a material consisting of silicon and oxygen.

4. The mask blank according to claim 1, wherein
the low transmission layer has a refractive index n of 2.0 or more at a wavelength of the exposure light, and an extinction coefficient k of 0.2 or more at a wavelength of the exposure light, and
the high transmission layer has a refractive index n of less than 2.0 at a wavelength of the exposure light, and an extinction coefficient k of 0.1 or less at a wavelength of the exposure light.

5. The mask blank according to claim 1, wherein
the low transmission layer has a thickness of 30 nm or less.

6. The mask blank according to claim 1, comprising a light shielding film on the phase shift film.

7. A mask blank comprising a phase shift film on a transparent substrate, wherein
the phase shift film has a function of transmitting exposure light of an ArF excimer laser at a transmittance of 20% or more,
the phase shift film includes a structure having two or more sets of a stacked structure, each set comprising a low transmission layer and a high transmission layer disposed in order from the transparent substrate side,
the low transmission layer is formed of a material containing silicon and nitrogen,
the high transmission layer is formed of a material containing silicon and oxygen,
the low transmission layer has a content of nitrogen larger than a content of nitrogen of the high transmission layer,
the high transmission layer has a content of oxygen larger than a content of oxygen of the low transmission layer,
the high transmission layer provided at an uppermost position is thicker than the high transmission layer provided at a position other than the uppermost position, and
the low transmission layer is thicker than the high transmission layer provided at a position other than the uppermost position.

8. The mask blank according to claim 7, wherein
the low transmission layer is formed of a material consisting of silicon and nitrogen, or a material consisting of silicon, nitrogen, and one or more elements selected from semimetal elements and non-metal elements, and
the high transmission layer is formed of a material consisting of silicon and oxygen, or a material consisting of silicon, oxygen, and one or more elements selected from semimetal elements and non-metal elements.

9. The mask blank according to claim 7, wherein
the low transmission layer is formed of a material consisting of silicon and nitrogen, and
the high transmission layer is formed of a material consisting of silicon and oxygen.

10. The mask blank according to claim 7, wherein
the low transmission layer has a refractive index n of 2.0 or more at a wavelength of the exposure light, and an extinction coefficient k of 0.2 or more at a wavelength of the exposure light, and
the high transmission layer has a refractive index n of less than 2.0 at a wavelength of the exposure light, and an extinction coefficient k of 0.1 or less at a wavelength of the exposure light.

11. The mask blank according to claim 7, wherein
the low transmission layer has a thickness of 30 nm or less.

12. The mask blank according to claim 7, comprising a light shielding film on the phase shift film.

13. A phase shift mask comprising, on a transparent substrate, a phase shift film having a transfer pattern, wherein
the phase shift film has a function of transmitting exposure light of an ArF excimer laser at a transmittance of 20% or more,
the phase shift film includes a structure having two or more sets of a stacked structure, each set comprising a low transmission layer and a high transmission layer disposed in order from the transparent substrate side,
the low transmission layer is formed of a material containing silicon and nitrogen and having a nitrogen content of 50 atom % or more,
the high transmission layer is formed of a material containing silicon and oxygen and having an oxygen content of 50 atom % or more,
the high transmission layer provided at an uppermost position is thicker than the high transmission layer provided at a position other than the uppermost position, and
the low transmission layer is thicker than the high transmission layer provided at a position other than the uppermost position.

14. The phase shift mask according to claim 13, wherein
the low transmission layer is formed of a material consisting of silicon and nitrogen, or a material consisting of silicon, nitrogen, and one or more elements selected from semimetal elements and non-metal elements, and
the high transmission layer is formed of a material consisting of silicon and oxygen, or a material consisting of silicon, oxygen, and one or more elements selected from semimetal elements and non-metal elements.

15. The phase shift mask according to claim 13, wherein
the low transmission layer is formed of a material consisting of silicon and nitrogen, and
the high transmission layer is formed of a material consisting of silicon and oxygen.

16. The phase shift mask according to claim 13, wherein
the low transmission layer has a refractive index n of 2.0 or more at a wavelength of the exposure light, and an extinction coefficient k of 0.2 or more at a wavelength of the exposure light, and
the high transmission layer has a refractive index n of less than 2.0 at a wavelength of the exposure light, and an extinction coefficient k of 0.1 or less at a wavelength of the exposure light.

17. The phase shift mask according to claim 13, wherein
the low transmission layer has a thickness of 30 nm or less.

18. The phase shift mask according to claim 13, comprising, on the phase shift film, a light shielding film having a pattern including a light shielding band.

19. A method of manufacturing a semiconductor device comprising the step of transferring by exposure a transfer pattern to a resist film on a semiconductor substrate using the phase shift mask according to claim 18.

20. A phase shift mask comprising, on a transparent substrate, a phase shift film having a transfer pattern, wherein the phase shift film has a function of transmitting exposure light of an ArF excimer laser at a transmittance of 20% or more, the phase shift film includes a structure having two or more sets of a stacked structure, each set comprising a low transmission layer and a high transmission layer disposed in order from the transparent substrate side, the low transmission layer is formed of a material containing silicon and nitrogen, the high transmission layer is formed of a material containing silicon and oxygen, the low transmission layer has a content of nitrogen larger than a content of nitrogen of the high transmission layer, the high transmission layer has a content of oxygen larger than a content of oxygen of the low transmission layer, the high transmission layer provided at an uppermost position is thicker than the high transmission layer provided at a position other than the uppermost position, and the low transmission layer is thicker than the high transmission layer provided at a position other than the uppermost position.

21. The phase shift mask according to claim 20, wherein the low transmission layer is formed of a material consisting of silicon and nitrogen, or a material consisting of silicon, nitrogen, and one or more elements selected from semimetal elements and non-metal elements, and the high transmission layer is formed of a material consisting of silicon and oxygen, or a material consisting of silicon, oxygen, and one or more elements selected from semimetal elements and non-metal elements.

22. The phase shift mask according to claim 20, wherein the low transmission layer is formed of a material consisting of silicon and nitrogen, and the high transmission layer is formed of a material consisting of silicon and oxygen.

23. The phase shift mask according to claim 20, wherein the low transmission layer has a refractive index n of 2.0 or more at a wavelength of the exposure light, and an extinction coefficient k of 0.2 or more at a wavelength of the exposure light, and the high transmission layer has a refractive index n of less than 2.0 at a wavelength of the exposure light, and an extinction coefficient k of 0.1 or less at a wavelength of the exposure light.

24. The phase shift mask according to claim 20, wherein the low transmission layer has a thickness of 30 nm or less.

25. The phase shift mask according to claim 20, comprising, on the phase shift film, a light shielding film having a pattern including a light shielding band.

26. A method of manufacturing a semiconductor device comprising the step of transferring by exposure a transfer pattern to a resist film on a semiconductor substrate using the phase shift mask according to claim 25.

* * * * *